(12) United States Patent
Kavala et al.

(10) Patent No.: US 10,439,632 B2
(45) Date of Patent: Oct. 8, 2019

(54) REFERENCE VOLTAGE GENERATOR AND SEMICONDUCTOR DEVICE INCLUDING THE SAME

(71) Applicant: Samsung Electronics Co., Ltd., Suwon-si (KR)

(72) Inventors: Anil Kavala, Yongin-si (KR); Seon-kyoo Lee, Hwaseong-si (KR); Byung-hoon Jeong, Hwaseong-si (KR); Jeong-don Ihm, Seongnam-si (KR); Young-don Choi, Seoul (KR)

(73) Assignee: SAMSING ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 16/191,367

(22) Filed: Nov. 14, 2018

(65) Prior Publication Data
US 2019/0158109 A1 May 23, 2019

(30) Foreign Application Priority Data

Nov. 17, 2017 (KR) .................. 10-2017-0153967

(51) Int. Cl.
*G05F 3/08* (2006.01)
*H03M 1/78* (2006.01)
*G11C 5/14* (2006.01)

(52) U.S. Cl.
CPC .............. *H03M 1/785* (2013.01); *G05F 3/08* (2013.01); *G11C 5/147* (2013.01)

(58) Field of Classification Search
CPC ........... G05F 3/08; G11C 5/147; H03M 1/785
(Continued)

(56) References Cited

U.S. PATENT DOCUMENTS 4,338,592 A * 7/1982 Wilensky ............ H03M 1/0863
341/118
5,933,107 A 8/1999 Tan
(Continued)

FOREIGN PATENT DOCUMENTS

JP 2005-295240 A 10/2005
KR 10-2005-0104599 A 11/2005

OTHER PUBLICATIONS

Park et al. / A 10b Linear Interpolation DAC using Body-Transconductance Control for AMLCD Column Driver / IEEE Asian Solid-State Circuits Conference / Nov. 8, 2010-Nov. 10, 2010 / 4 pages / Beijing, China.
(Continued)

*Primary Examiner* — William Hernandez
(74) *Attorney, Agent, or Firm* — Muir Patent Law, PLLC

(57) ABSTRACT

A semiconductor device includes a reference voltage generator configured to output a reference voltage. The reference voltage generator includes a boosting code circuit and a first digital-analog converter (DAC). The boosting code circuit includes a first boosting pulse generator configured to generate a first boosting pulse and a first boosting code controller configured to output a first boosting code based on a reference code and the first boosting pulse. The first DAC is configured to output the reference voltage by converting the first boosting code. The first boosting code has a first code value different from the reference code when the first boosting pulse has a first logic level, and the first boosting code has the same value as the reference code when the first boosting pulse has a second logic level opposite to the first logic level.

20 Claims, 20 Drawing Sheets

(58) Field of Classification Search
USPC .......................... 327/172, 173, 174, 530, 538
See application file for complete search history.

(56) References Cited

U.S. PATENT DOCUMENTS

| | | | |
|---|---|---|---|
| 6,166,672 | A | 12/2000 | Park |
| 7,283,082 | B1 | 10/2007 | Kuyel |
| 7,916,059 | B2 | 3/2011 | Kim et al. |
| 8,542,144 | B2 | 9/2013 | Coban |
| 8,830,103 | B2 | 9/2014 | Suzuki |
| 8,912,940 | B2 | 12/2014 | Dempsey |
| 9,083,380 | B2 | 7/2015 | Price et al. |
| 9,136,866 | B2 | 9/2015 | Downey et al. |
| 9,553,603 | B2 | 1/2017 | Kikuta |
| 10,110,244 | B1 * | 10/2018 | Pietri ............... H03M 1/682 |
| 2010/0052963 | A1 * | 3/2010 | Soude ............... H03M 1/808 |
| | | | 341/144 |
| 2016/0133218 | A1 | 5/2016 | Morita |
| 2016/0133219 | A1 | 5/2016 | Morita |
| 2016/0359497 | A1 * | 12/2016 | Thomsen ........... H03K 5/003 |

OTHER PUBLICATIONS

J. Guerber et al. / Ternary R2R DAC design for improved energy efficiency / Electronics Letters / Feb. 28, 2013, vol. 49, No. 5 / 2 pages.
B. D. Smith / Coding by Feedback Methods / Proceedings of the IRE, vol. 41, No. 8, pp. 1053-1058 / Aug. 1953 / 6 pages.

* cited by examiner

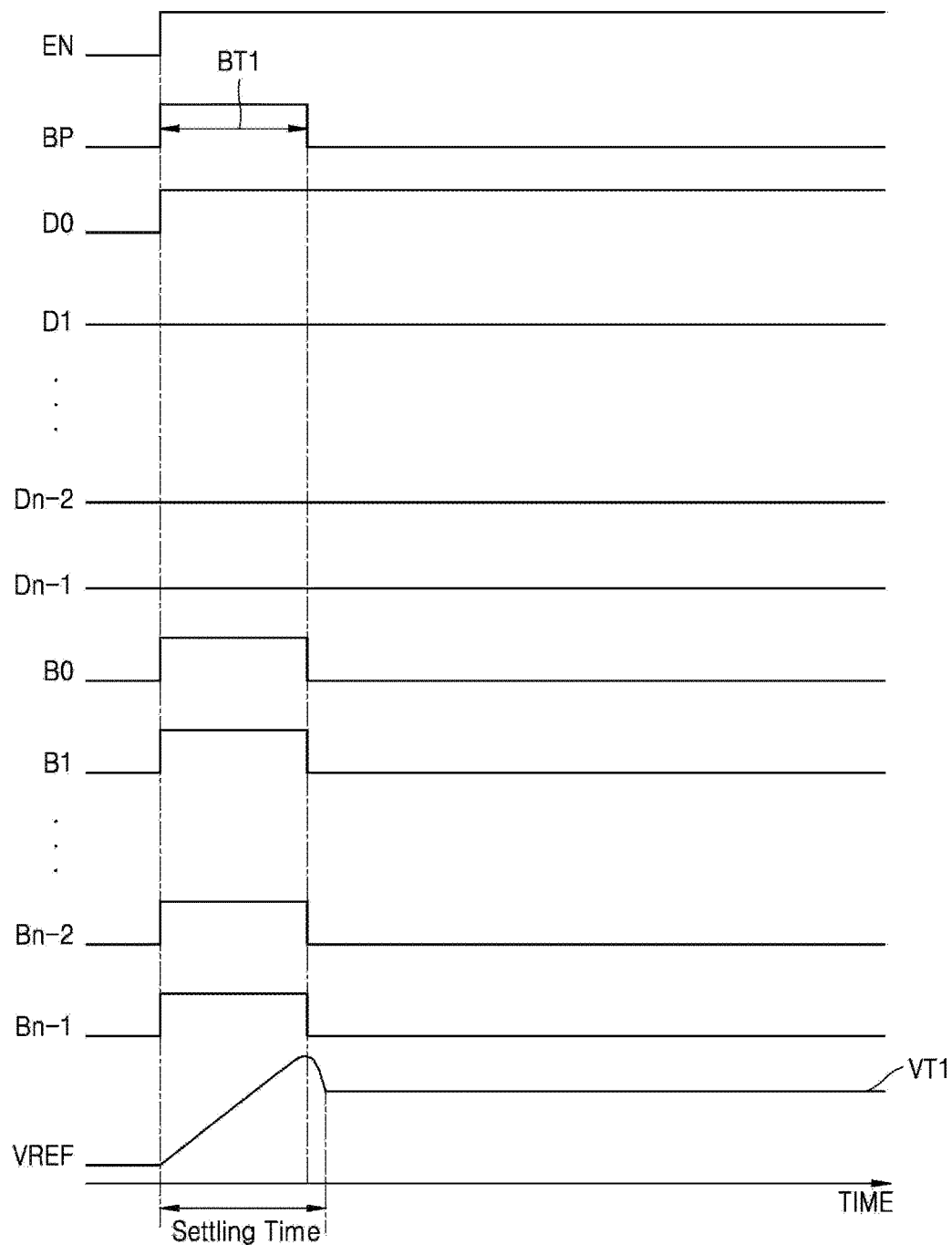

REFERENCE VOLTAGE GENERATOR AND SEMICONDUCTOR DEVICE INCLUDING THE SAME

CROSS-REFERENCE TO RELATED APPLICATION

This application claims the benefit of Korean Patent Application No. 10-2017-0153967, filed on Nov. 17, 2017, in the Korean Intellectual Property Office, the disclosure of which is incorporated herein in its entirety by reference.

BACKGROUND

The present disclosure relates to a reference voltage generator and a semiconductor device including the same, and more particularly, to a reference voltage generator including a digital-analog converter and a memory device.

In a semiconductor device such as a memory device, a reference voltage may be used for various purposes, and as a speed at which a reference voltage generator included in the semiconductor device generates a reference voltage increases, the performance of the semiconductor device may improve.

The reference voltage generator includes a digital-analog converter, and generates a reference voltage based on a digital signal input to the reference voltage generator. As a converting speed of the digital-analog converter increases, a speed at which the reference voltage generator generates a reference voltage may increase.

SUMMARY

The present disclosure provides a reference voltage generator capable of outputting a boosting code to a digital-analog converter included in the reference voltage generator and thus increasing a converting speed of the digital-analog converter, and a memory device including the reference voltage generator.

According to an aspect of the inventive concept, there is provided a semiconductor device including a reference voltage generator configured to output a reference voltage. The reference voltage generator includes a boosting code circuit and a first digital-analog converter (DAC). The boosting code circuit includes a first boosting pulse generator configured to generate a first boosting pulse and a first boosting code controller configured to output a first boosting code based on a reference code and the first boosting pulse. The first DAC is configured to output the reference voltage by converting the first boosting code. The first boosting code has a first code value different from the reference code when the first boosting pulse has a first logic level, and the first boosting code has the same value as the reference code when the first boosting pulse has a second logic level opposite to the first logic level.

According to another aspect of the inventive concept, there is provided a semiconductor device including a reference voltage generator configured to output a reference voltage. The reference voltage generator includes a boosting code circuit and a first digital-analog converter (DAC). The boosting code circuit includes a boosting pulse generator configured to generate a boosting pulse and a boosting code controller configured to output a boosting code based on a reference code and the boosting pulse. The first DAC configured to output the reference voltage having a first voltage level by converting the boosting code having a different value from the reference code during a pulse duration of the boosting pulse, and output the reference voltage having a second voltage level less than the first voltage level by converting the boosting code having the same value as the reference code after the pulse duration of the boosting pulse when the boosting code circuit is activated.

According to another aspect of the inventive concept, there is provided a semiconductor device including a reference voltage generator configured to output a reference voltage. The reference voltage generator includes a boosting code circuit and a digital-analog converter (DAC). The boosting code circuit includes a boosting code controller configured to output a boosting code based on a reference code. The DAC is configured to output the reference voltage having a first voltage level by converting the boosting code having a different value from the reference code during a first period of time after enabling the boosting code circuit, and output the reference voltage having a second voltage level less than the first voltage level by converting the boosting code having the same value as the reference code during a second period of time after the first period of time.

BRIEF DESCRIPTION OF THE DRAWINGS

Embodiments of the inventive concept will be more clearly understood from the following detailed description taken in conjunction with the accompanying drawings in which:

FIGS. 6A to 6D are timing diagrams for describing example embodiments of an operation of the reference voltage generator of FIG. 5;

DETAILED DESCRIPTION

Figure 1:
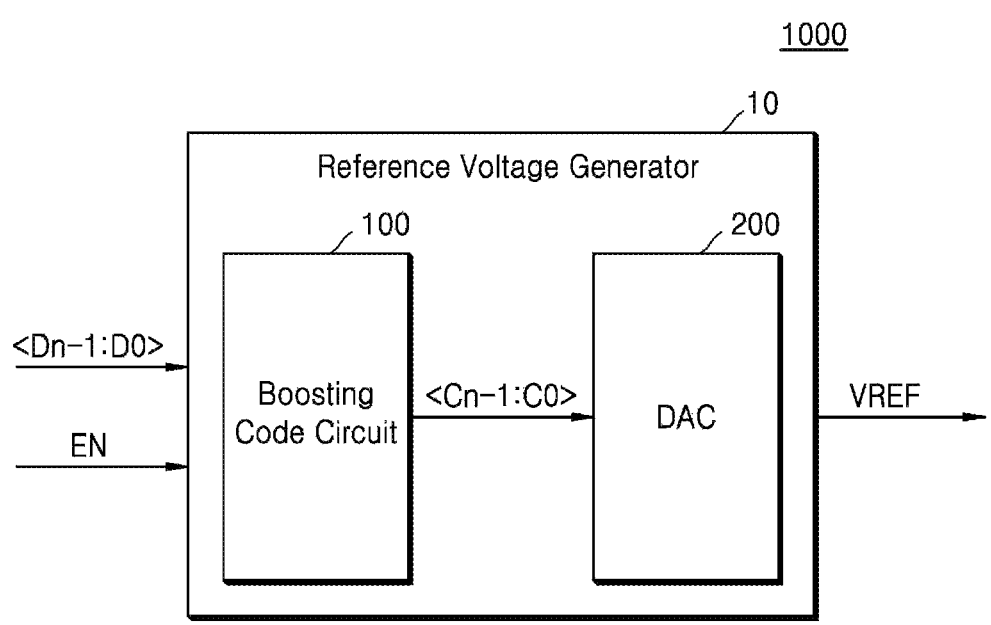
FIG. 1 is a block diagram of a reference voltage generator according to an example embodiment of the present disclosure.

FIG. 1 is a block diagram of a reference voltage generator 10 in a semiconductor device 1000 according to an example embodiment of the present disclosure.

As used herein, a semiconductor device may refer to various items such as a memory device, one or more logic devices formed in or on a semiconductor substrate, a semiconductor chip, a memory chip, a logic chip, a package, or combinations thereof. A semiconductor device such as a semiconductor chip, a memory chip, or a logic chip may be formed from a wafer. A semiconductor device may comprise a package which may include one or more chips stacked on a package substrate, or a package-on-package device including a plurality of packages. A semiconductor device may include a reference voltage generator.

An electronic device, as used herein, may refer to one of these devices and may also include products that include these devices, such as a memory module, a hard drive including additional components, a mobile phone, laptop, tablet, desktop, camera, server, computing system, or other consumer electronic device, etc.

Referring to FIG. 1, the reference voltage generator 10 may receive an enable signal EN, and an n-bit reference code <Dn-1:D0> which is a digital signal. The reference voltage generator 10 may perform an operation of generating a reference voltage VREF based on the reference code <Dn-1:D0> when the enable signal EN has a first logic level. In this regard, n may be a natural number equal to or greater than 2, and the first logic level may be a high level. However, the present disclosure is not limited thereto, and the reference voltage generator 10 may generate the reference voltage VREF when the enable signal EN has a low level.

The reference code <Dn-1:D0> may be a digital signal having a value corresponding to a level of the reference voltage VREF. Accordingly, the reference voltage generator 10 may generate the reference voltage VREF having a target voltage level corresponding to the reference code <Dn-1:D0>.

The reference voltage generator 10 may include a boosting code circuit 100 and a digital-analog converter (DAC) 200. The boosting code circuit 100 may control a boosting operation on the DAC 200. In an embodiment, the boosting code circuit 100 may receive the reference code <Dn-1:D0>, and may perform a boosting operation during a boosting time period starting from a point in time at which the enable signal EN is transitioned to a high level. Accordingly, a converting operation speed of the DAC 200 may increase.

In an embodiment, the boosting code circuit 100 may generate a boosting code <Cn-1:C0> having a different code from the reference code <Dn-1:D0> during a boosting time period and having the same code as the reference code <Dn-1:D0> after the boosting time period.

The DAC 200, which is a circuit that generates an analog signal by converting a received digital signal, may generate the reference voltage VREF by converting the boosting code <Cn-1:C0>. The DAC 200 may generate the reference voltage VREF having a target voltage level, based on the boosting code <Cn-1:C0>.

The reference voltage generator 10 according to an example embodiment of the present disclosure includes the boosting code circuit 100, and thus, a settling time, which is time taken for the reference voltage generator 10 to generate the reference voltage VREF having a target voltage level by converting the boosting code <Cn-1:C0>, may be reduced. Accordingly, a speed at which the reference voltage generator 10 generates the reference voltage VREF having a target voltage level may increase.

Figure 2:
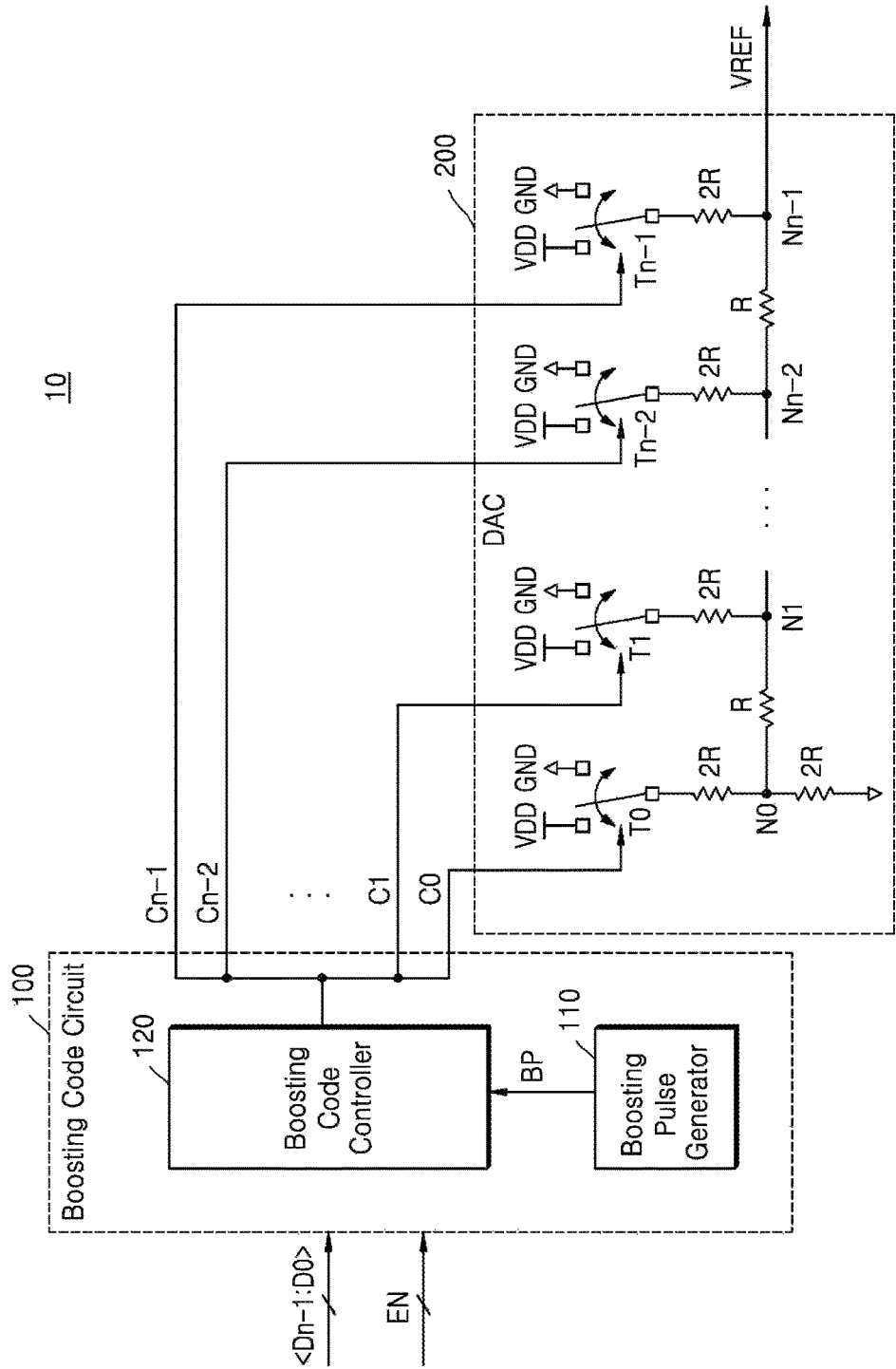
FIG. 2 is a block diagram of the reference voltage generator of FIG. 1 according to an example embodiment of the present disclosure.

FIG. 2 is a block diagram of the reference voltage generator 10 of FIG. 1 according to an example embodiment of the present disclosure. As described above with reference to FIG. 1, the reference voltage generator 10 may receive the reference code <Dn-1:D0>, and may generate the reference voltage VREF having a target voltage level corresponding to the reference code <Dn-1:D0>. The reference voltage generator 10 may include the boosting code circuit 100 and the DAC 200.

Referring to FIG. 2, the boosting code circuit 100 may include a boosting pulse generator 110 and a boosting code controller 120. The boosting code circuit 100 may receive the enable signal EN and the reference code <Dn-1:D0>. The boosting code circuit 100 may control a boosting operation on the DAC 200 during a certain boosting time period.

The boosting pulse generator 110 may generate a boosting pulse BP having a first logic level during a boosting time period (e.g., during a pulse duration) starting from a point in time at which the enable signal EN having a high level is received and having a second logic level after the boosting time period. For example, the boosting pulse generator 110 may generate the boosting pulse BP to be wide as much as the boosting time period. For example, the first logic level may be a high level, and the second logic level may be a low level. However, the present disclosure is not limited thereto, and the first logic level may be a low level, and the second logic level may be a high level. In an embodiment, the boosting pulse generator 110 may determine a boosting time period based on the reference code <Dn-1:D0>. In some embodiments, the boosting pulse generator 110 may generate the boosting pulse BP having a high level for a certain time period regardless of the reference code <Dn-1:D0>. The boosting time period will be described below with reference to FIG. 3C.

The boosting code controller 120 may receive the reference code <Dn-1:D0> and the boosting pulse BP, and may output the boosting code <Cn-1:C0>, based on the reference code <Dn-1:D0> and the boosting pulse BP. The boosting code <Cn-1:C0> may be a code different from the reference code <Dn-1:D0> during the boosting time period. For example, the boosting code <Cn-1:C0> may have a code value boosted from the reference code <Dn-1:D0>. The boosting code <Cn-1:C0> may have the same value as the reference code <Dn-1:D0> after the boosting time period. In this regard, the boosting code controller 120 generating a boosting code from the reference code <Dn-1:D0> may be expressed as the boosting code circuit 100 performing a boosting operation. The boosting code <Cn-1:C0> will be described below with reference to FIGS. 3A to 3C.

The DAC 200 may receive the boosting code <Cn-1:C0> from the boosting code circuit 100, and may generate the reference voltage VREF, based on the boosting code <Cn-1:C0>. In an embodiment, the DAC 200 may be an R-2R ladder DAC. The DAC 200 may include a plurality of first resistors R and a plurality of second resistors 2R having different resistance values from the plurality of first resistors R, and each of the plurality of second resistors 2R may have twice as much a resistance value as each of the plurality of first resistors R.

The DAC 200 may include n switches T0~Tn-1 corresponding to a bit number of the reference code <Dn-1:D0>. For example, the n switches T0~Tn-1 may be realized as a plurality of transistors, for example, a plurality of inverters, but the present disclosure is not limited thereto. Each of the n switches T0~Tn-1 may be controlled by the boosting code <Cn-1:C0>.

In example embodiments, when the boosting code <Cn-1:C0> has a logic high level, the n switches T0~Tn-1 may be connected to a power voltage VDD, and thus, the power voltage VDD and ends of the plurality of second resistors 2R may be connected to each other. When the boosting code <Cn-1:C0> has a logic low level, the n switches T0~Tn-1 may be connected to a ground voltage GND, and thus, the ground voltage GND and ends of the plurality of second resistors 2R may be connected to each other. Accordingly, voltages of a plurality of nodes N0~Nn-1 of the DAC 200 may be changed by the n switches T0~Tn-1. For example, first ends of the plurality of second resistors 2R are connected to the power voltage VDD and second ends of the plurality of second resistors 2R are connected to each of the plurality of nodes N0~Nn-1.

In other example embodiments, when the boosting code <Cn-1:C0> has a logic low level, the n switches T0~Tn-1 may be connected to the power voltage VDD, and thus, the power voltage VDD and ends of the plurality of second resistors 2R may be connected to each other. When the boosting code <Cn-1:C0> has a high level, the n switches T0~Tn-1 may be connected to the ground voltage GND, and thus, the ground voltage GND and ends of the plurality of second resistors 2R may be connected to each other.

Accordingly, the DAC 200 may generate different reference voltages VREF according to the boosting code <Cn-1:C0>. The DAC 200 may generate the reference voltage VREF having a higher level as a value of the boosting code <Cn-1:C0> increases.

Figure 3A:
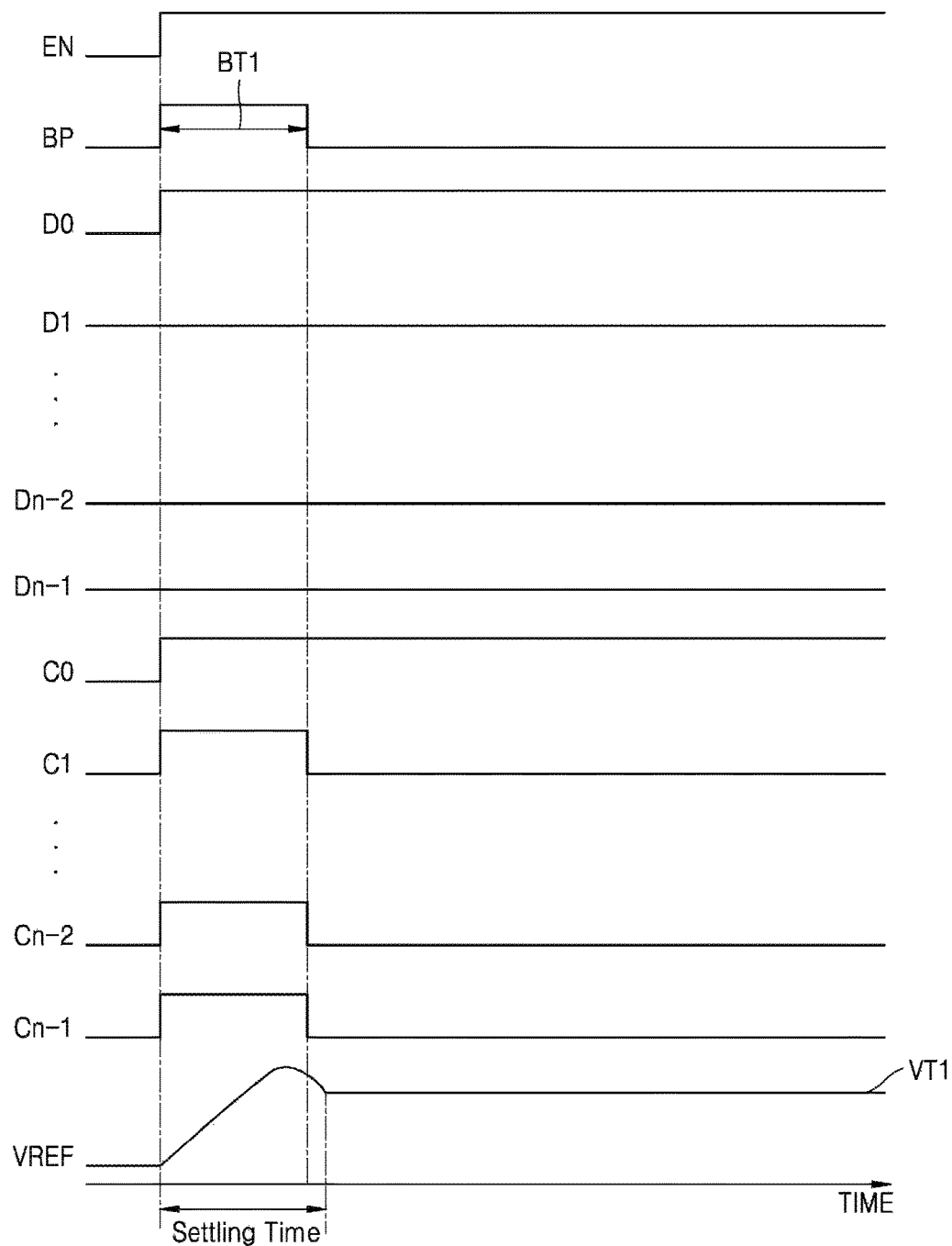
FIGS. 3A to 3C are timing diagrams for describing example embodiments of an operation of the reference voltage generator of FIG. 2.
Figure 3B:
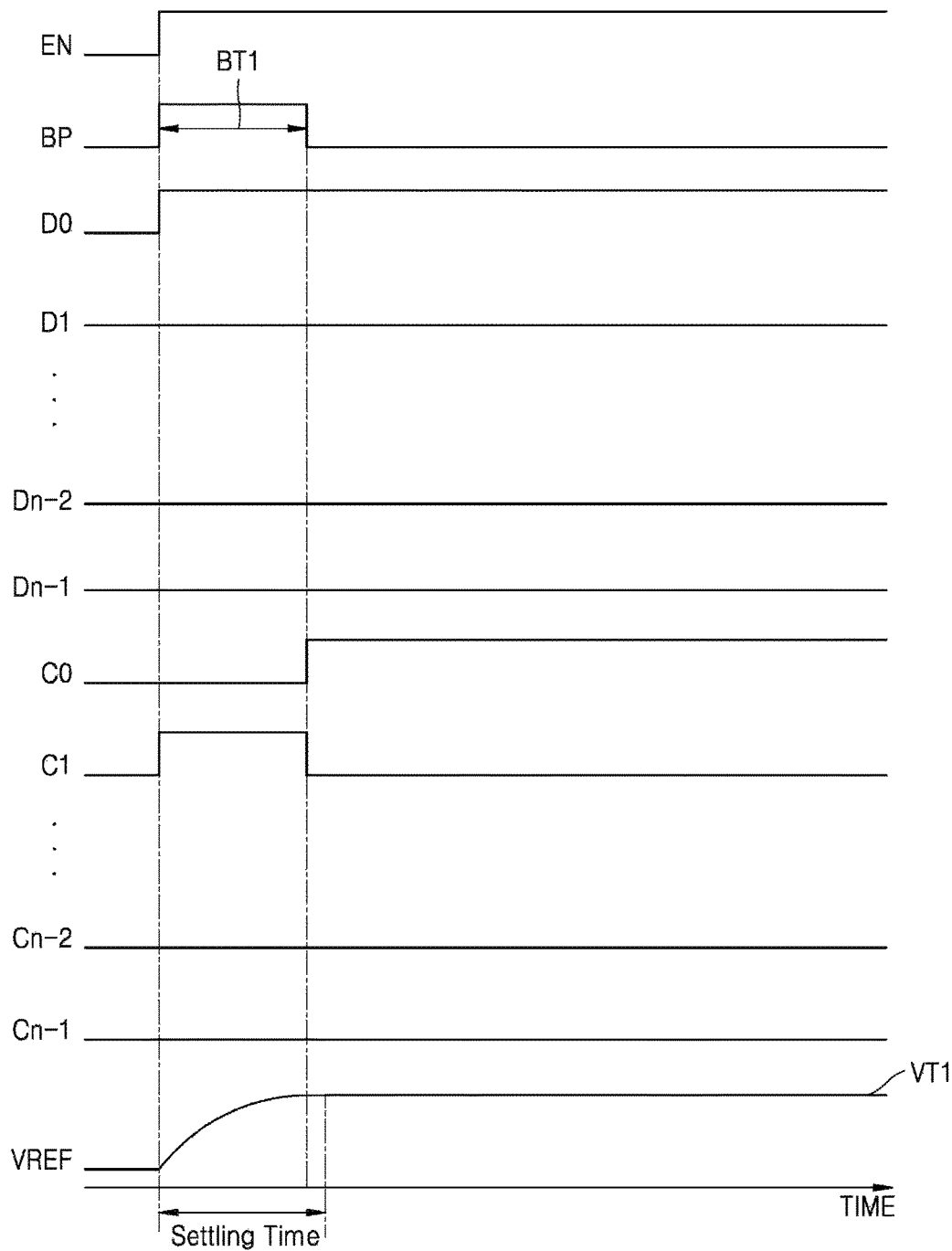
Figure 3C:
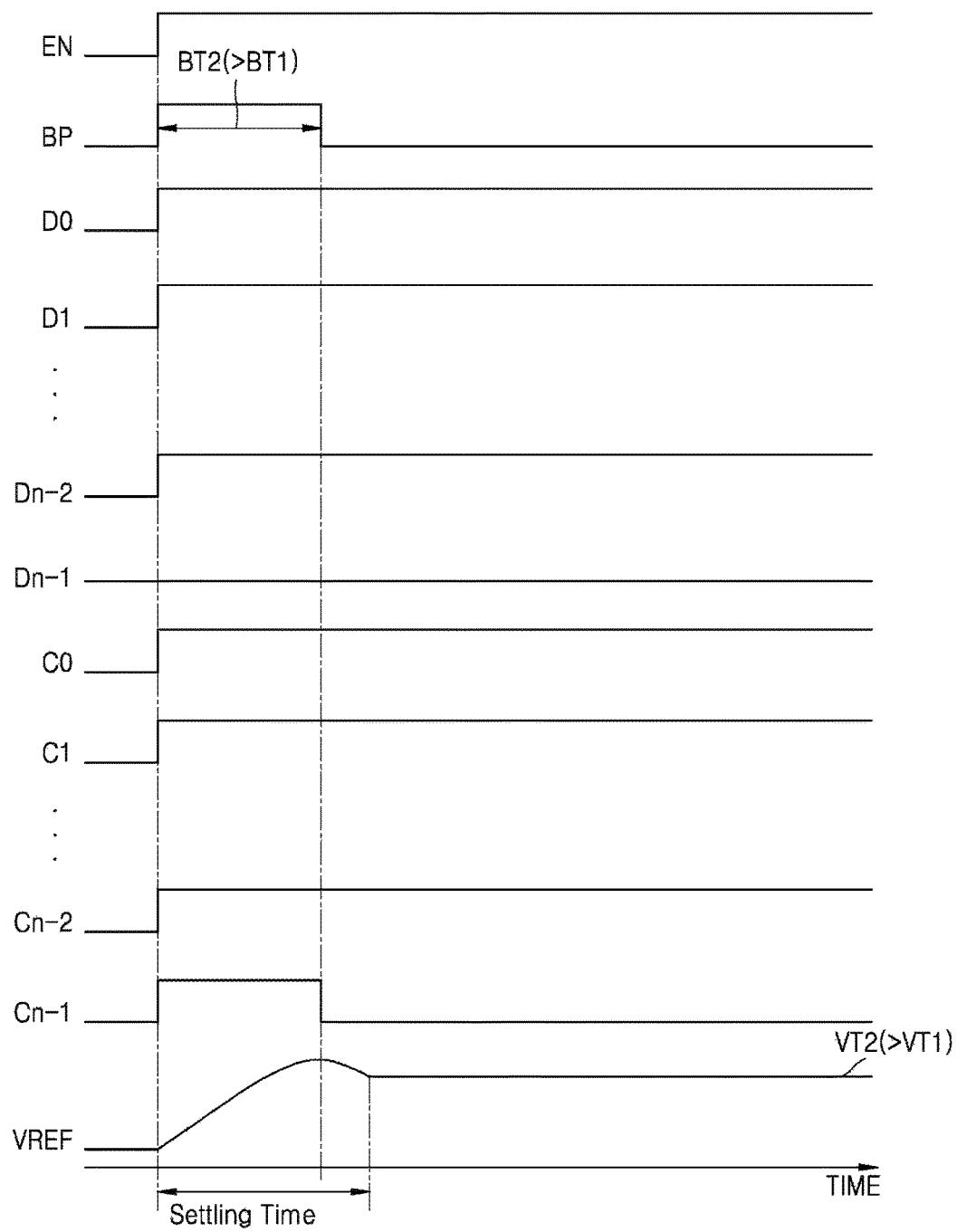

FIGS. 3A to 3C are timing diagrams for describing an example embodiments of an operation of the reference voltage generator 10 of FIG. 2.

Referring to FIGS. 2 and 3A, the reference voltage generator 10 may generate the reference voltage VREF having a target voltage level corresponding to the reference code <Dn-1:D0>, based on the enable signal EN and the reference code <Dn-1:D0>.

The boosting code controller 120 may receive the reference code <Dn-1:D0> and the boosting pulse BP, and may output the boosting code <Cn-1:C0>. In an embodiment, the boosting code controller 120 may output the boosting code <Cn-1:C0> having a code value corresponding to a maximum target voltage level, based on the boosting pulse BP having a high level. For example, the boosting code controller 120 may output the boosting code <Cn-1:C0> all having a value of 1 during a boosting time period. The boosting code controller 120 may output the boosting code <Cn-1:C0> that is the same as the reference code <Dn-1:D0>, when the boosting pulse BP having a low level.

For example, when the reference code <Dn-1:D0> is 00 . . . 01, the boosting pulse generator 110 may generate a boosting pulse BP having a first boosting time period BT1. The boosting code controller 120 may generate the boosting code <Cn-1:C0> that is 11 . . . 11 during the first boosting time period BT1, and may generate the boosting code <Cn-1:C0> that is 00 . . . 01, which is the same as the reference code <Dn-1:D0>, after the first boosting time period BT1.

The reference voltage generator 10 according to an embodiment of the present disclosure may perform a boosting operation on the DAC 200 during the first boosting time period BT1. As the boosting code <Cn-1:C0> becomes 11 . . . 11 during the first boosting time period BT1, the n switches T0~Tn-1 may be connected to the power voltage VDD, and a voltage may be applied to the nodes N0~Nn-1. Accordingly, the reference voltage VREF may rapidly increase, and may rapidly reach a first target voltage level VT1. A settling time taken for the reference voltage VREF to reach the first target voltage level VT1 may decrease, and a speed at which the reference voltage generator 10 generates the reference voltage VREF having the first target voltage level VT1 may increase.

Referring to FIGS. 2 and 3B, the boosting code controller 120 may generate the boosting code <Cn-1:C0> having a code value corresponding to a reference voltage having a level that is twice as much as the first target voltage level VT1 during the first boosting time period BT1. In an example embodiment, the boosting code controller 120 may generate the boosting code <Cn-1:C0> having a value that is twice as much as that of the reference code <Dn-1:D0> during the first boosting time period BT1. For example, when the reference code <Dn-1:D0> is 00 . . . 01, the boosting code controller 120 may output the boosting code <Cn-1:C0> that is 00 . . . 10 during the first boosting time period BT1. After the first boosting time period BT1, the boosting code controller 120 may output the boosting code <Cn-1:C0> that is 00 . . . 01, which is the same as the reference code <Dn-1:D0>. Accordingly, as a value of the reference code <Dn-1:D0> increases, a value of the boosting code <Cn-1:C0> during a boosting time period may also increase.

As the boosting code <Cn-1:C0> is generated to have a value that is twice as much as that of the reference code <Dn-1:D0> during the first boosting time period BT1, the reference voltage VREF may relatively rapidly increase during the boosting time period, and may rapidly reach the first target voltage level VT1. Accordingly, the settling time taken for the reference voltage VREF to reach the first target voltage level VT1 may decrease.

Referring to FIGS. 2 to 3C, the boosting pulse generator 110 may generate the boosting pulse BP, based on the reference code <Dn-1:D0>. In an embodiment, the boosting pulse generator 110 may generate the boosting pulse BP having a boosting time period proportional to a target voltage level of the reference voltage VREF corresponding to the reference code <Dn-1:D0>. Accordingly, the boosting pulse generator 110 of FIG. 2 may generate the boosting pulse BP having a boosting time period proportional to a value of the reference code <Dn-1:D0>.

For example, as shown in FIG. 3A, when the reference code <Dn-1:D0> is 00 . . . 01, the boosting pulse generator 110 may generate the boosting pulse BP having a high level during the first boosting time period BT1 starting from a point in time at which the enable signal EN is transitioned to a high level and having a low level after the first boosting time period BT1. On the other hand, as shown in FIG. 3C, when the reference code <Dn-1:D0> is 01 . . . 11, the boosting pulse generator 110 may generate a boosting pulse BP having a high level during a second boosting time period BT2 starting from a point in time at which the enable signal EN is transitioned to a high level and having a low level after the second boosting time period BT2. Since a value of the reference code <Dn-1:D0> of FIG. 3C is greater than that of the reference code <Dn-1:D0> of FIG. 3A, the second boosting time period BT2 of FIG. 3C may be longer than the first boosting time period BT1 of FIGS. 3A and 3B.

Since the reference code <Dn-1:D0> of FIG. 3C has a greater value than the reference code <Dn-1:D0> of FIG. 3A, a second target voltage level VT2 corresponding to the reference code <Dn-1:D0> of FIG. 3C may have a greater value than the first target voltage level VT1 corresponding to the reference code <Dn-1:D0> of FIG. 3A. When a boosting operation is not performed by the boosting code circuit 100, the time taken for the DAC 200 to generate the reference voltage VREF having the second target voltage level VT2 may be longer than the time taken for the DAC 200 to generate the reference voltage VREF having the first target voltage level VT1. Accordingly, the boosting pulse generator 110 may perform a long boosting operation by generating the second boosting pulse BP2 having the second boosting time period BT2 relatively longer, and may reduce the settling time taken for the reference voltage VREF to reach the second target voltage level VT2.

Referring to FIGS. 3A to 3C, the reference voltage generator 10 according to an example embodiment of the present disclosure may adjust a boosting time period, based on the reference code <Dn-1:D0>, and may also adjust a value of the boosting code <Cn-1:C0>. Thus, the settling time taken for the reference voltage VREF to reach a target voltage level may be effectively reduced.

Figure 4:
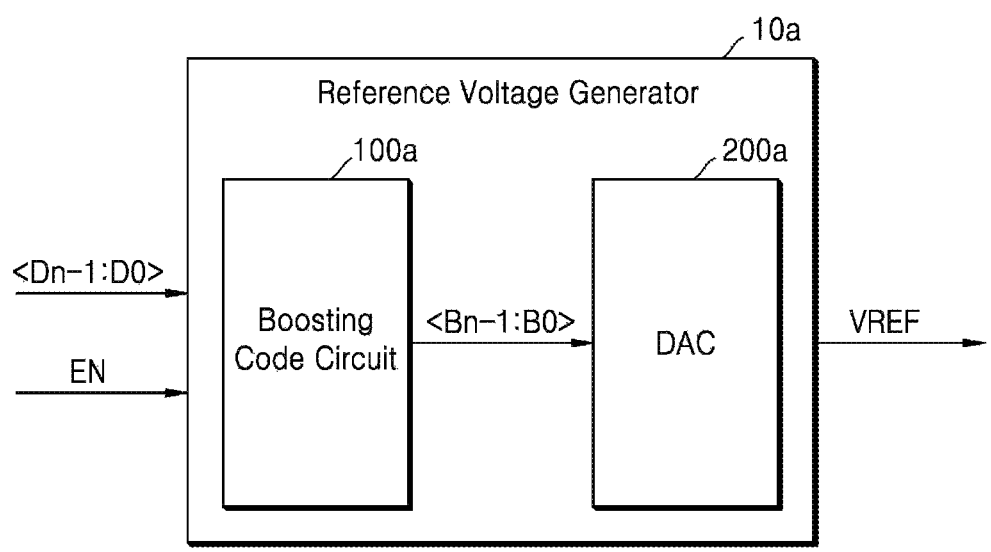
FIG. 4 is a block diagram of a reference voltage generator according to an example embodiment of the present disclosure.

FIG. 4 is a block diagram of a reference voltage generator 10a according to an example embodiment of the present disclosure.

Referring to FIG. 4, the reference voltage generator 10a may receive the enable signal EN and the reference code <Dn-1:D0>, and may generate the reference voltage VREF based on the reference code <Dn-1:D0> when the enable signal EN has a first logic level (for example, a high level).

The reference voltage generator 10a may include a boosting code circuit 100a and a DAC 200a. The boosting code circuit 100a may receive the reference code <Dn-1:D0>. The boosting code circuit 100a may output an n-bit boosting code <Bn-1:B0>, which is a digital signal, to the DAC 200a. The boosting code <Bn-1:B0> may have a constant code value during a boosting time period starting from a point in time at which the enable signal EN is transitioned to a high level. The boosting code <Bn-1:B0> will be described below with reference to FIGS. 6A to 6D.

The DAC 200a may receive the reference code <Dn-1:D0> and the boosting code <Bn-1:B0>, and may generate the reference voltage VREF, which is an analog signal, by converting the reference code <Dn-1:D0>. In an embodiment, the DAC 200a may be an R-2R ladder DAC, and based on the boosting code <Bn-1:B0>, a boosting operation in which a voltage is applied to each of a plurality of nodes of the DAC 200a may be performed.

The reference voltage generator 10a according to an example embodiment of the present disclosure includes the boosting code circuit 100a, and thus, the settling time taken for the reference voltage generator 10a to generate the reference voltage VREF having a target voltage level (e.g., VT1) by converting the reference code <Dn-1:D0> may be reduced. Accordingly, a speed at which the reference voltage generator 10a generates the reference voltage VREF having a target voltage level may increase.

Figure 5:
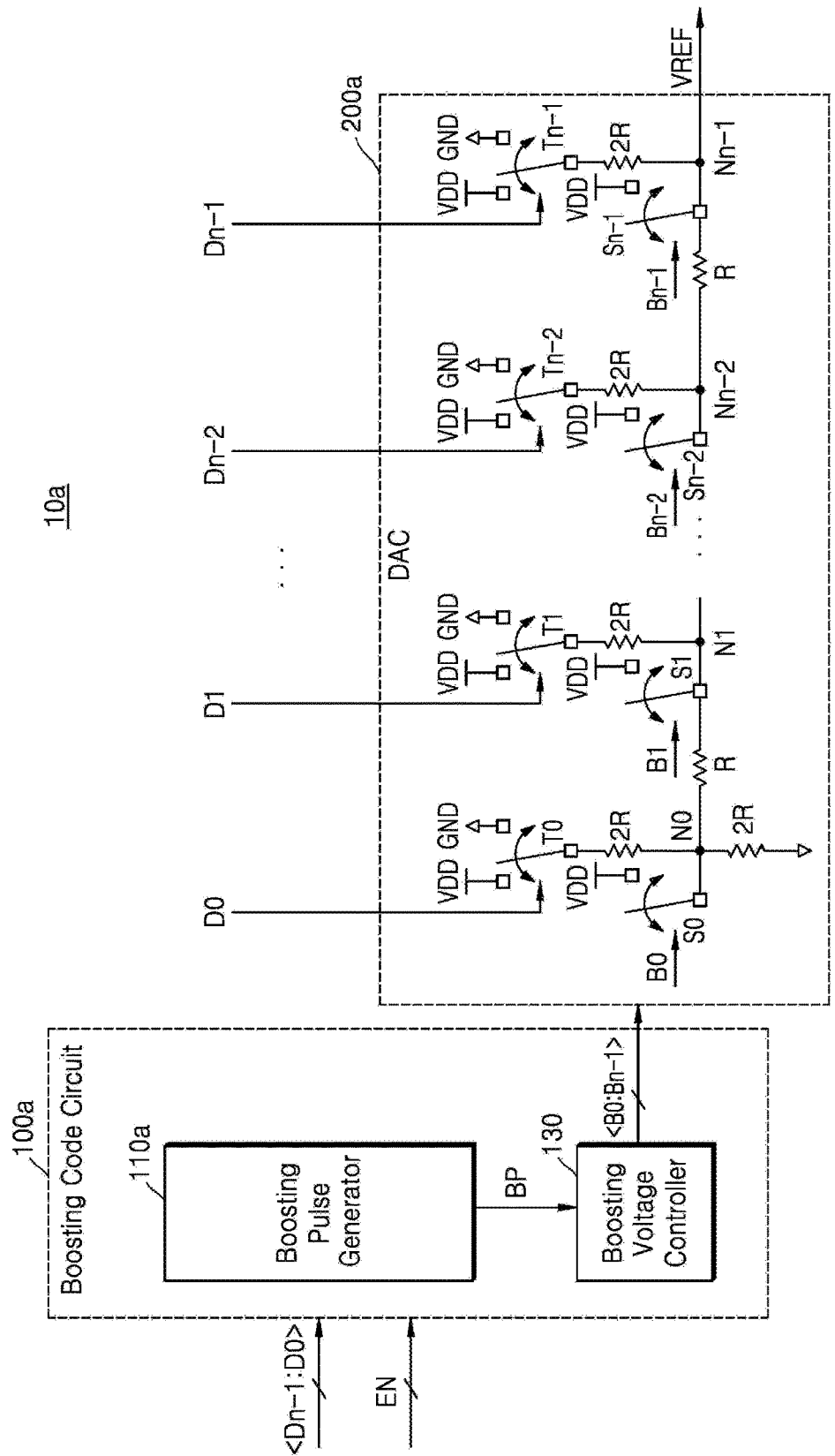
FIG. 5 is a block diagram of the reference voltage generator of FIG. 4 according to an example embodiment of the present disclosure.

FIG. 5 is a block diagram of the reference voltage generator 10a of FIG. 4 according to an example embodiment of the present disclosure. As described above with reference to FIG. 4, the reference voltage generator 10a may receive the reference code <Dn-1:D0>, and may generate the reference voltage VREF having a target voltage level (e.g., VT1) corresponding to the reference code <Dn-1:D0>. The reference voltage generator 10a may include the boosting code circuit 100a and the DAC 200a.

Referring to FIG. 5, the boosting code circuit 100a may include a boosting pulse generator 110a and a boosting voltage controller 130. The boosting code circuit 100a may receive the enable signal EN and the reference code <Dn-1:D0>. The boosting code circuit 100a may control a boosting operation on the DAC 200a during a certain boosting time period.

The boosting pulse generator 110a may generate a boosting pulse BP having a first logic level (for example, a high level) during a certain boosting time period starting from a point in time at which the enable signal EN is transitioned to a high level and having a second logic level (for example, a low level) after the boosting time period. In an embodiment, the boosting pulse generator 110a may determine a boosting time period, based on the reference code <Dn-1:D0>. In some embodiments, the boosting pulse generator 110a may generate the boosting pulse BP having a high level for a certain time period regardless of the reference code <Dn-1:D0>. The boosting time period will be described below with reference to FIG. 6D.

The boosting voltage controller 130 may receive the reference code <Dn-1:D0> and the boosting pulse BP, and may output the boosting code <Bn-1:B0>, based on the reference code <Dn-1:D0> and the boosting pulse BP. The boosting code <Bn-1:B0> will be described below with reference to FIGS. 6A to 6C.

The DAC 200a may receive the reference code <Dn-1:D0>, and may generate the reference voltage VREF, based on the reference code <Dn-1:D0>. In an embodiment, the DAC 200a may be an R-2R ladder DAC. The DAC 200a may include the plurality of first resistors R and the plurality of second resistors 2R having different resistance values from the plurality of first resistors R, and each of the plurality of second resistors 2R may have twice as much a resistance value as each of the plurality of first resistors R. In this regard, the DAC 200a may further include a plurality of switches S0~Sn-1, for example, a plurality of transistors, and each of the plurality of nodes N0~Nn-1 may be connected to the power voltage VDD through the plurality of switches S0~Sn-1. For example, when the boosting code <Bn-1:B0> has a logic high level, each of the plurality of nodes N0~Nn-1 may be connected to the power voltage VDD, and when the boosting code <Bn-1:B0> has a logic low level, the plurality of switches S0~Sn-1 may be open. In an embodiment, the plurality of switches S0~Sn-1 may be realized as a plurality of transistors, but the present disclosure is not limited thereto. The plurality of switches S0~Sn-1 may be controlled by the boosting code <Bn-1:B0>, and accordingly, connection between the plurality of nodes N0~Nn-1 and the power voltage VDD may be controlled by the boosting code <Bn-1:B0>.

The DAC 200a may include the n switches T0~Tn-1 corresponding to a bit number of the reference code <Dn-1:D0>. The n switches T0~Tn-1 may be controlled by the reference code <Dn-1:D0>. The DAC 200a may generate different reference voltages VREF according to the boosting code <Bn-1:B0>, and for example, the DAC 200a may generate the reference voltage VREF having a higher level as a value of the reference code <Dn-1:D0> increases.

FIGS. 6A to 6D are timing diagrams for describing an example embodiments of an operation of the reference voltage generator 10a of FIG. 5.

Referring to FIGS. 5 and 6A, the reference voltage generator 10a may generate the reference voltage VREF having a target voltage level corresponding to the reference code <Dn-1:D0>, based on the enable signal EN and the reference code <Dn-1:D0>.

The boosting voltage controller 130 may receive the reference code <Dn-1:D0> and the boosting pulse BP, and may output the boosting code <Bn-1:B0>. In an embodiment, the boosting voltage controller 130 may output the boosting code <Bn-1:B0> all having a value of 1 during a first boosting time period BT1, based on the boosting pulse BP having a high level. The boosting voltage controller 130 may output the boosting code <Bn-1:B0> all having a value of 0, based on the boosting pulse BP having a low level.

Accordingly, due to the boosting code <Bn-1:B0>, the plurality of switches S0~Sn-1 may all be connected to the power voltage VDD during the boosting time period BT1, and the power voltage VDD may be applied to the plurality of nodes N0~Nn-1. When the first boosting time period BT1 is finished, the plurality of switches S0-Sn-1 may be open, and the plurality of nodes N0-Nn-1 may each have a voltage value corresponding to the reference code <Dn-1:D0>.

For example, when the reference code <Dn-1:D0> is 00 . . . 01, the boosting pulse generator 110a may generate the boosting pulse BP having the first boosting time period BT1. The boosting voltage controller 130 may generate the boosting code <Bn-1:B0> that is 11 . . . 11 during the first boosting time period BT1, and may generate the boosting code <Bn-1:B0> that is 00. . . 00 after the first boosting time period BT1.

The reference voltage generator 10a according to an embodiment of the present disclosure may perform a boosting operation on the DAC 200a during the first boosting time period BT1. In this regard, output, via the boosting voltage controller 130, of the boosting code <Bn-1:B0> allowing at least one of the plurality of switches S0-Sn-1 to be connected to the power voltage VDD may be referred to as the boosting operation on the DAC 200a.

As the boosting code <Bn-1:B0> becomes 11 . . . 11 during the boosting time period, the reference voltage VREF may rapidly increase, and may rapidly reach the first target voltage level VT1. Accordingly, the settling time taken for the reference voltage VREF to reach the first target voltage level VT1 may decrease, and a speed at which the reference voltage generator 10a generates the reference voltage VREF having the first target voltage level VT1 may increase.

Figure 6B:
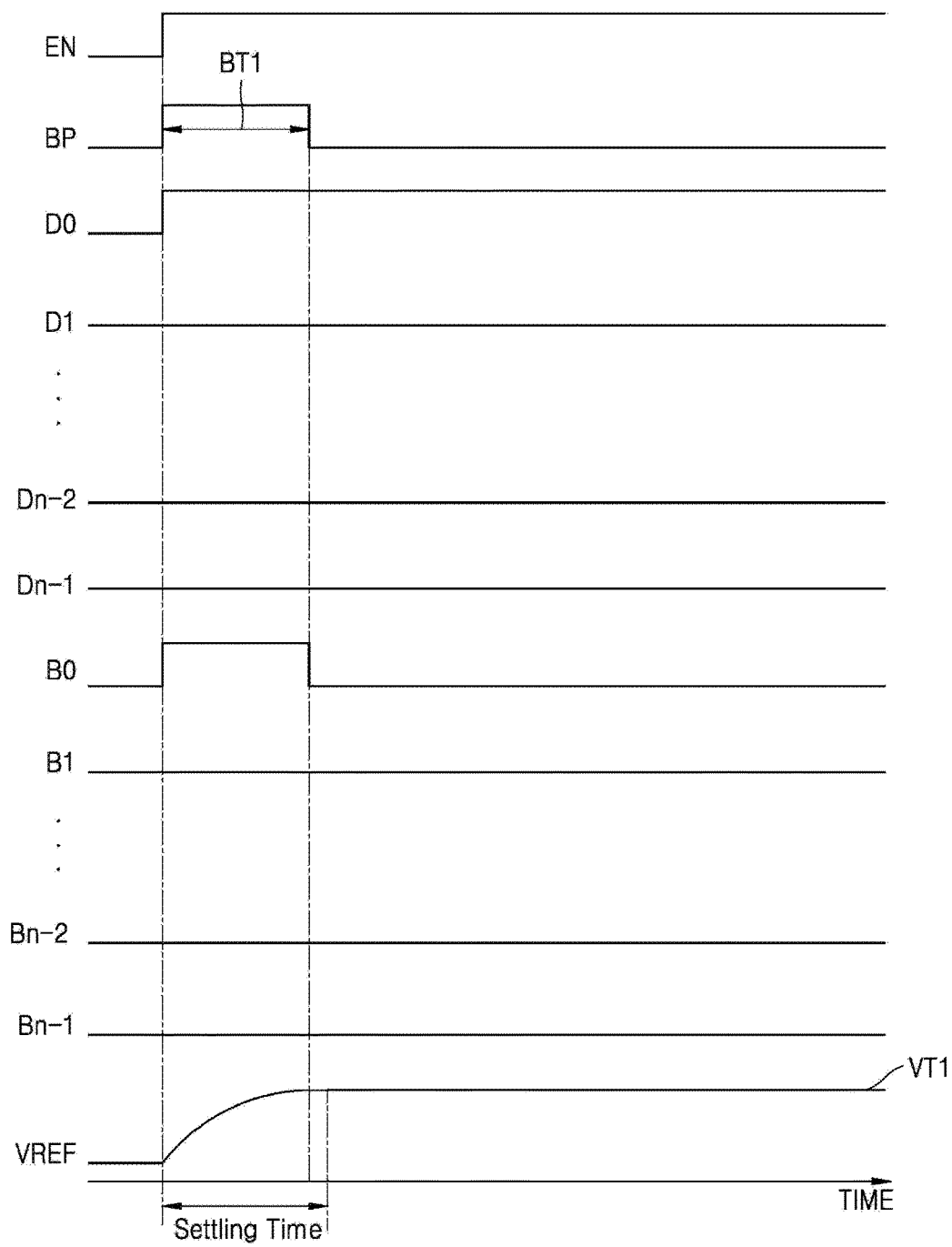

Referring to FIGS. 5 and 6B, the boosting voltage controller 130 may output the boosting code <Bn-1:B0> that is the same as the reference code <Dn-1:D0> during the boosting time period, based on the boosting pulse BP and the reference code <Dn-1:D0>.

For example, when the reference code <Dn-1:D0> is 00 . . . 01, the boosting voltage controller 130 may output the boosting code <Bn-1:B0> that is 00 . . . 01 during the first boosting time period BT1. After the first boosting time period BT1, the boosting voltage controller 130 may output the boosting code <Bn-1:B0> that is 00 . . . 00. Accordingly, as a value of the reference code <Dn-1:D0> increases, a value of the boosting code <Bn-1:B0> during the boosting time period may also increase.

Since the power voltage VDD is additionally applied to the plurality of nodes N0~Nn-1 by the boosting code <Bn-1:B0> as well as the reference code <Dn-1:D0> during the first boosting time period BT1, the reference voltage VREF may relatively rapidly increase, and may rapidly reach the target voltage level. Accordingly, the settling time taken for the reference voltage VREF to reach a target voltage may decrease.

Figure 6C:
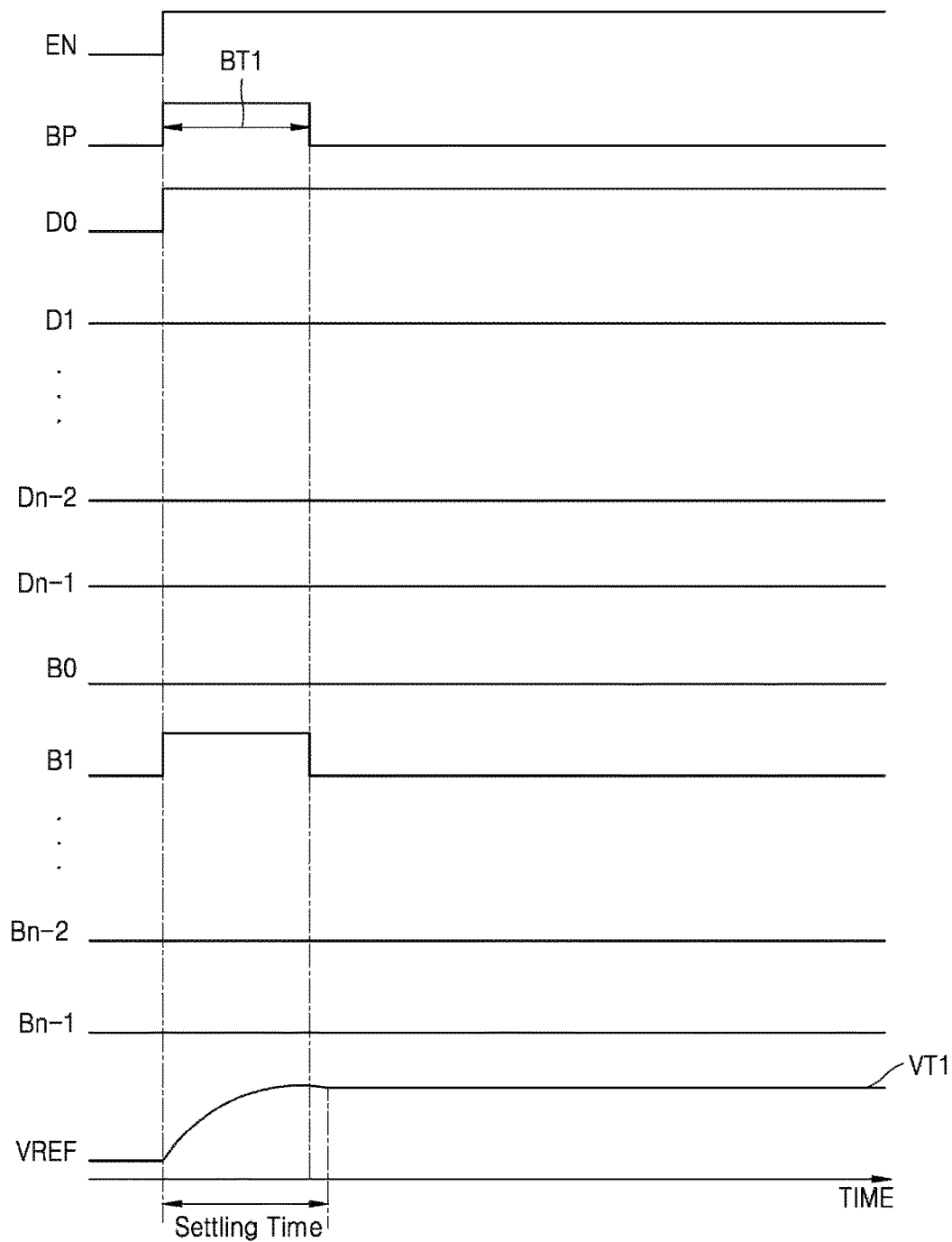

Referring to FIGS. 5 and 6C, the boosting voltage controller 130 may output the boosting code <Bn-1:B0> having a value proportional to that of the reference code <Dn-1:D0> during the boosting time period, based on the boosting pulse BP and the reference code <Dn-1:D0>.

In an embodiment, during the first boosting time period BT1, a value of the boosting code <Bn-1:B0> may be twice as much as that of the reference code <Dn-1:D0>. For example, when the reference code <Dn-1:D0> is 00 . . . 01, the boosting voltage controller 130 may output the boosting code <Bn-1:B0> that is 00 . . . 10 during the first boosting time period BT1. After the first boosting time period BT1, the boosting voltage controller 130 may output the boosting code <Bn-1:B0> that is 00. . . 00. Accordingly, as a value of the reference code <Dn-1:D0> increases, a value of the boosting code <Bn-1:B0> during the first boosting time period BT1 may also increase.

As the boosting code <Bn-1:B0> is generated to have a value that is twice as much as that of the reference code <Dn-1:D0> during the first boosting time period BT1, the reference voltage VREF may relatively rapidly increase, and may rapidly reach the first target voltage level VT1. Accordingly, the settling time taken for the reference voltage VREF to reach the first target voltage level VT1 may decrease.

Figure 6D:
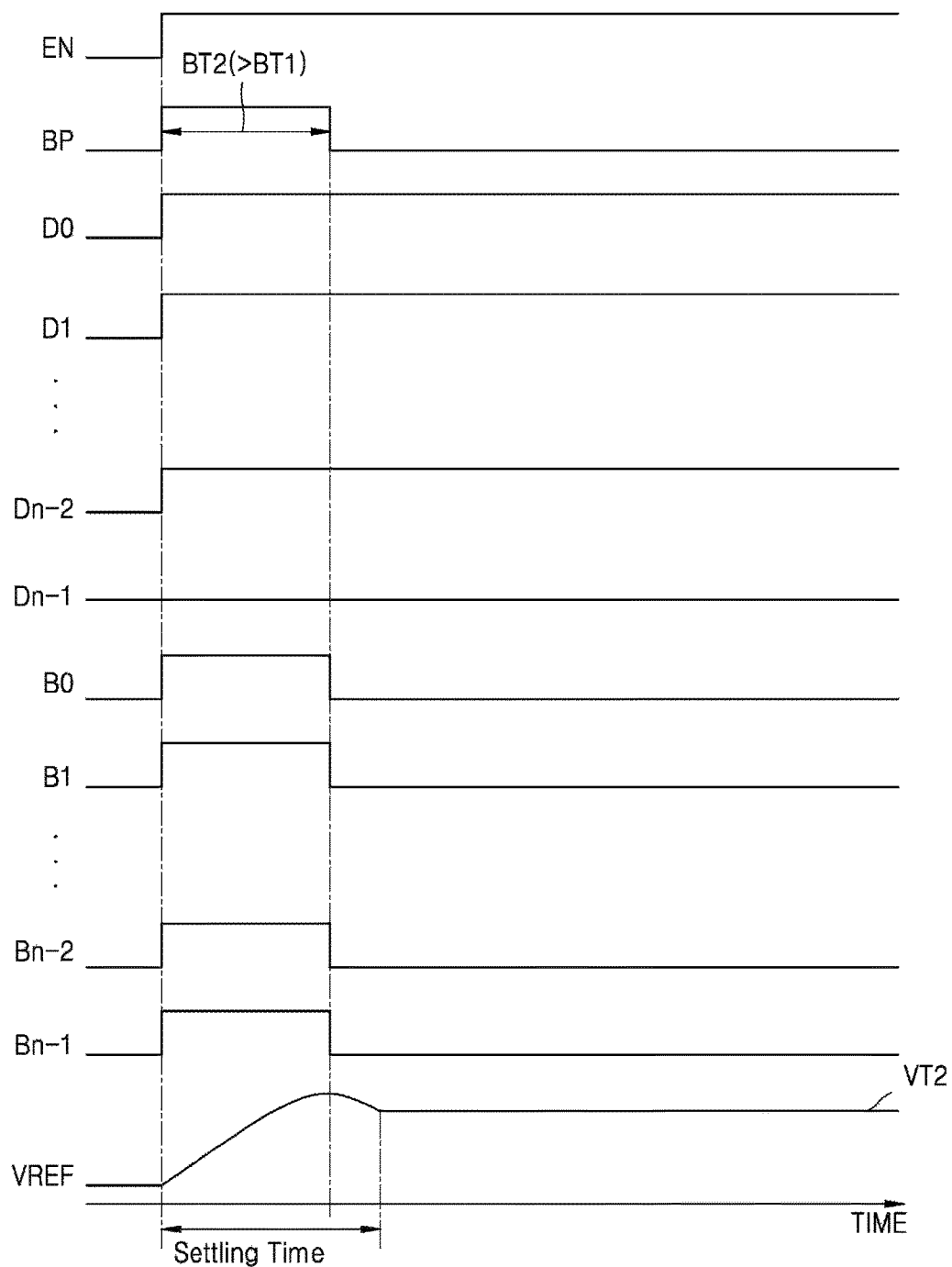

Referring to FIGS. 5, 6A, and 6D, the boosting pulse generator 110a may generate the boosting pulse BP, based on the reference code <Dn-1:D0>. In an embodiment, the boosting pulse generator 110a may generate the boosting pulse BP having a boosting time period proportional to a target voltage level of the reference voltage VREF corresponding to the reference code <Dn-1:D0>. Accordingly, the boosting pulse generator 110a of FIG. 5 may generate the boosting pulse BP having a boosting time period proportional to a value of the reference code <Dn-1:D0>.

For example, as shown in FIG. 6A, when the reference code <Dn-1:D0> is 00 . . . 01, the boosting pulse generator 110a may generate the boosting pulse BP having the first boosting time period BT1. On the other hand, as shown in FIG. 6D, when the reference code <Dn-1:D0> is 01 . . . 11, the boosting pulse generator 110a may generate a second boosting pulse BP2 having a second boosting time period BT2. In this regard, since a value of the reference code <Dn-1:D0> of FIG. 6D is greater than that of the reference code <Dn-1:D0> of FIG. 6A, the second boosting time period BT2 of FIG. 6D may be longer than the first boosting time period BT1 of FIG. 6A.

Since the reference code <Dn-1:D0> of FIG. 6D has a greater value than the reference code <Dn-1:D0> of FIG. 6A, the second target voltage level VT2 corresponding to the reference code <Dn-1:D0> of FIG. 6D may have a greater value than the first target voltage level VT1 corresponding to the reference code <Dn-1:D0> of FIG. 6A. Accordingly, the boosting pulse generator 110a may perform a long boosting operation by generating the second boosting pulse BP2 having the second boosting time period BT2 relatively longer, and may reduce the settling time taken for the reference voltage VREF to reach the second target voltage level VT2.

Referring to FIGS. 6A to 6D, the reference voltage generator 10a according to an example embodiment of the present disclosure may adjust a boosting time period, based on a value of the reference code <Dn-1:D0>, and may also adjust a value of the boosting code <Bn-1:B0>. Thus, the settling time taken for the reference voltage VREF to reach a target voltage level may be effectively reduced.

Figure 7:
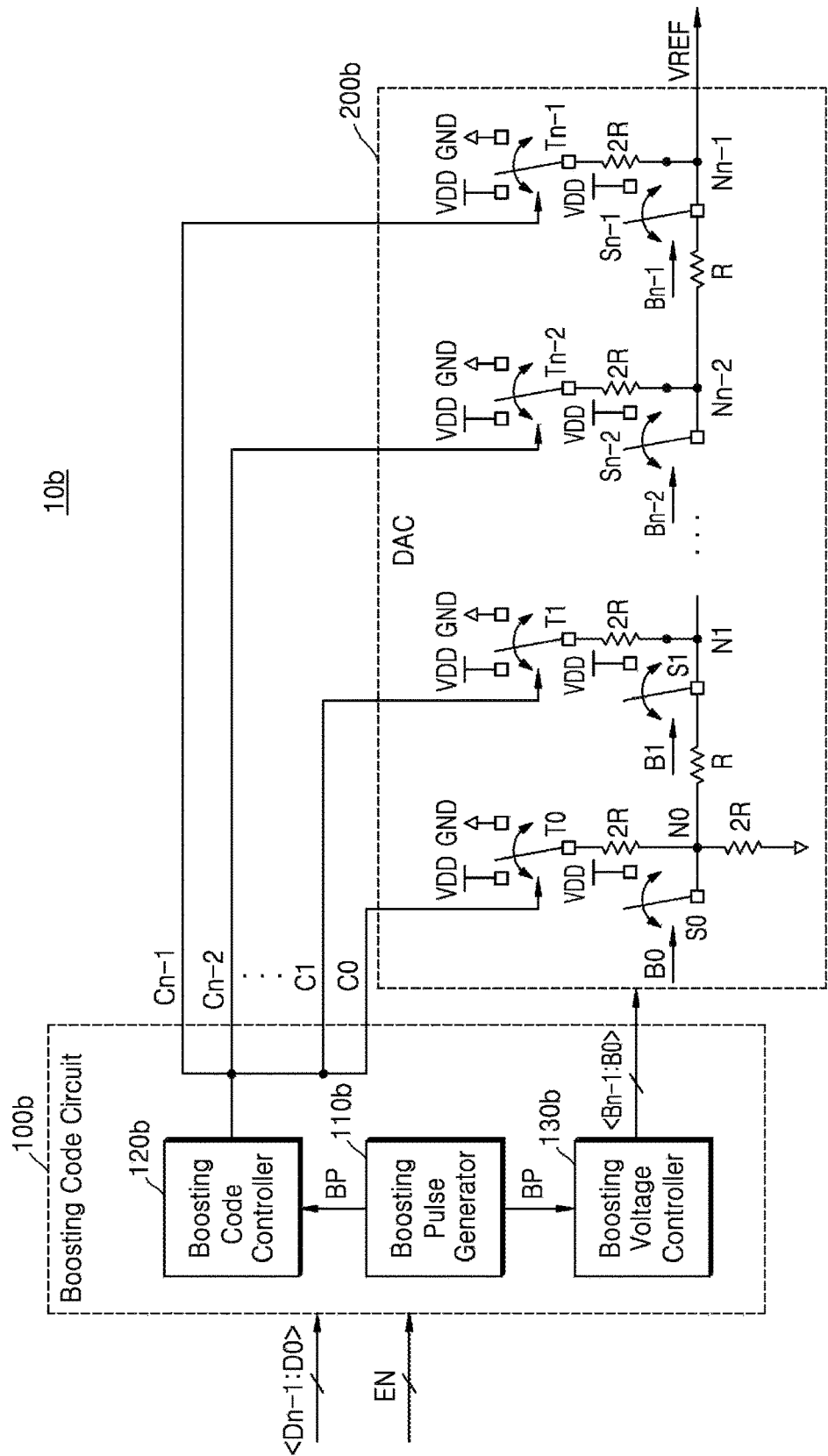
FIG. 7 is a block diagram of a reference voltage generator according to an example embodiment of the present disclosure.

FIG. 7 is a block diagram of a reference voltage generator 10b according to an example embodiment of the present disclosure.

Referring to FIG. 7, the reference voltage generator 10b may receive the reference code <Dn-1:D0> and the enable signal EN, and may generate the reference voltage VREF having a target voltage level corresponding to the reference code <Dn-1:D0>. The reference voltage generator 10b may include a boosting code circuit 100b and a DAC 200b.

The boosting code circuit 100b may include a boosting pulse generator 110b, a boosting code controller 120b, and a boosting voltage controller 130b. The boosting code circuit 100b may perform a boosting operation on the DAC 200b during a certain boosting time period.

The boosting pulse generator 110b may generate the boosting pulse BP having a first logic level (for example, a high level) during a boosting time period starting from a point in time at which the enable signal EN having a first logic level (e.g., a high level) is received and having a second logic level (e.g., a low level) after the boosting time period. In an embodiment, as described above with reference to FIGS. 3C and 6D, the boosting pulse generator 110b may determine a boosting time period, based on the reference code <Dn-1:D0>. In some embodiments, the boosting pulse generator 110b may generate the boosting pulse BP having a high level for a certain time period regardless of the reference code <Dn-1:D0>.

The boosting code controller 120b may receive the reference code <Dn-1:D0> and the boosting pulse BP, and may output a first boosting code <Cn-1:C0>, based on the reference code <Dn-1:D0> and the boosting pulse BP. The first boosting code <Cn-1:C0> may be different from the reference code <Dn-1:D0> during the boosting time period, and may be the same as the reference code <Dn-1:D0> after the boosting time period. Description of the boosting code <Cn-1:C0> given with reference to FIGS. 3A to 3C may be applied the same to the first boosting code <Cn-1:C0>.

The boosting voltage controller 130b may receive the reference code <Dn-1:D0> and the boosting pulse BP, and may output a second boosting code <Bn-1:B0>, based on the reference code <Dn-1:D0> and the boosting pulse BP. Due to the second boosting code <Bn-1:B0>, at least one of the plurality of switches S0~Sn-1 of the DAC 200b may be connected to the power voltage VDD during the boosting time period. The second boosting code <Bn-1:B0> may all have a value of 0 after the boosting time period. Description of the boosting code <Bn-1:B0> given with reference to FIGS. 6A to 6D may be applied the same to the second boosting code <Bn-1:B0>.

The DAC 200b may include a plurality of first switches T0~Tn-1 and a plurality of second switches S0~Sn-1, the first boosting code <Cn-1:C0> may control the plurality of first switches T0~Tn-1, and the second boosting code <Bn-1:B0> may control the plurality of second switches S0~Sn-1.

The DAC 200b may generate the reference voltage VREF having a target voltage level, based on the first boosting code <Cn-1:C0>, and may be boosted during the boosting time period, based on the first boosting code <Cn-1:C0> and the second boosting code <Bn-1:B0>.

The reference voltage generator 10b according to an example embodiment of the present disclosure may adjust a boosting time period, based on a value of the reference code <Dn-1:D0>, and may also adjust values of the first boosting code <Cn-1:C0> and the second boosting code <Bn-1:B0>. Thus, the settling time taken for the reference voltage VREF to reach a target voltage level may be reduced.

Figure 8:
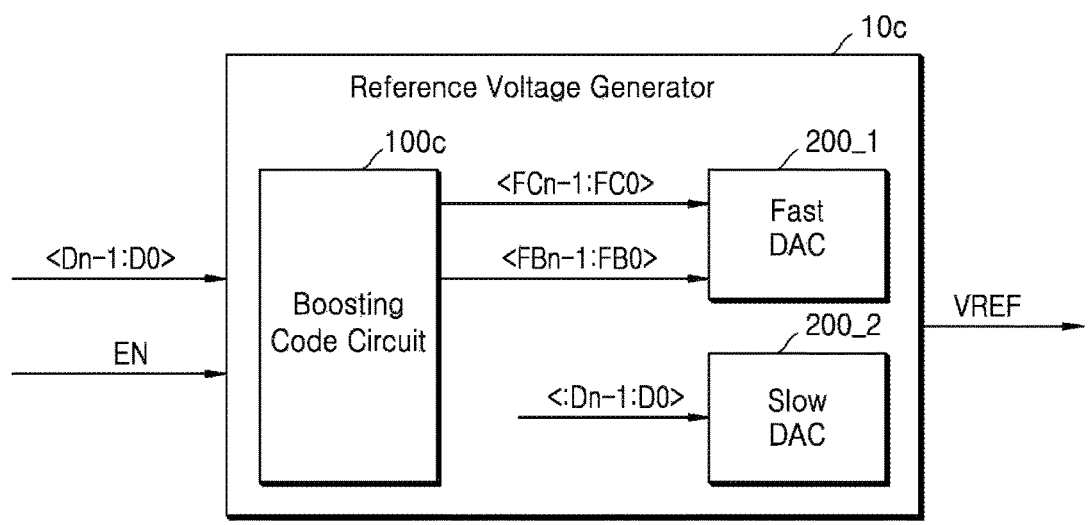
FIG. 8 is a block diagram of a reference voltage generator according to an example embodiment of the present disclosure.

FIG. 8 is a block diagram of a reference voltage generator 10c according to an example embodiment of the present disclosure.

Referring to FIG. 8, the reference voltage generator 10c may receive the enable signal EN and the reference code <Dn-1:D0>, and may generate the reference voltage VREF having a target voltage level corresponding to the reference code <Dn-1:D0>, based on the reference code <Dn-1:D0>.

The reference voltage generator 10c may include a boosting code circuit 100c, a fast DAC 200_1, and a slow DAC 200_2. The fast DAC 200_1 may have the same configuration as the DAC 200b of FIG. 7, and description of the DAC 200b of FIG. 7 may be applied the same to the fast DAC 200_1. The fast DAC 200_1 and the slow DAC 200_2 will be described below with reference to FIG. 9.

The boosting code circuit 100c may transmit a first fast boosting code <FCn-1:FC0> and a second fast boosting code <FBn-1:FB0> to the fast DAC 200_1, based on the reference code <Dn-1:D0>. The fast DAC 200_1 may output the reference voltage VREF, based on the first fast boosting code <FCn-1:FC0>. The first fast boosting code <FCn-1:FC0> and the second fast boosting code <FBn-1:FB0> will be described below with reference to FIG. 10.

The slow DAC 200_2 may receive the reference code <Dn-1:D0>, and may output the reference voltage VREF, based on the reference code <Dn-1:D0>. The slow DAC 200_2 requires a longer settling time of the reference voltage VREF than the fast DAC 200_1, but may have less power consumption.

The reference voltage generator 10c according to an example embodiment of the present disclosure includes the boosting code circuit 100c, the fast DAC 200_1, and the slow DAC 200_2, and thus, the settling time taken for the reference voltage generator 10c to generate the reference voltage VREF having a target voltage level by converting the reference code <Dn-1:D0> may be reduced. In addition, power consumed to generate the reference voltage VREF may be reduced by using the slow DAC 200_2.

Figure 9:
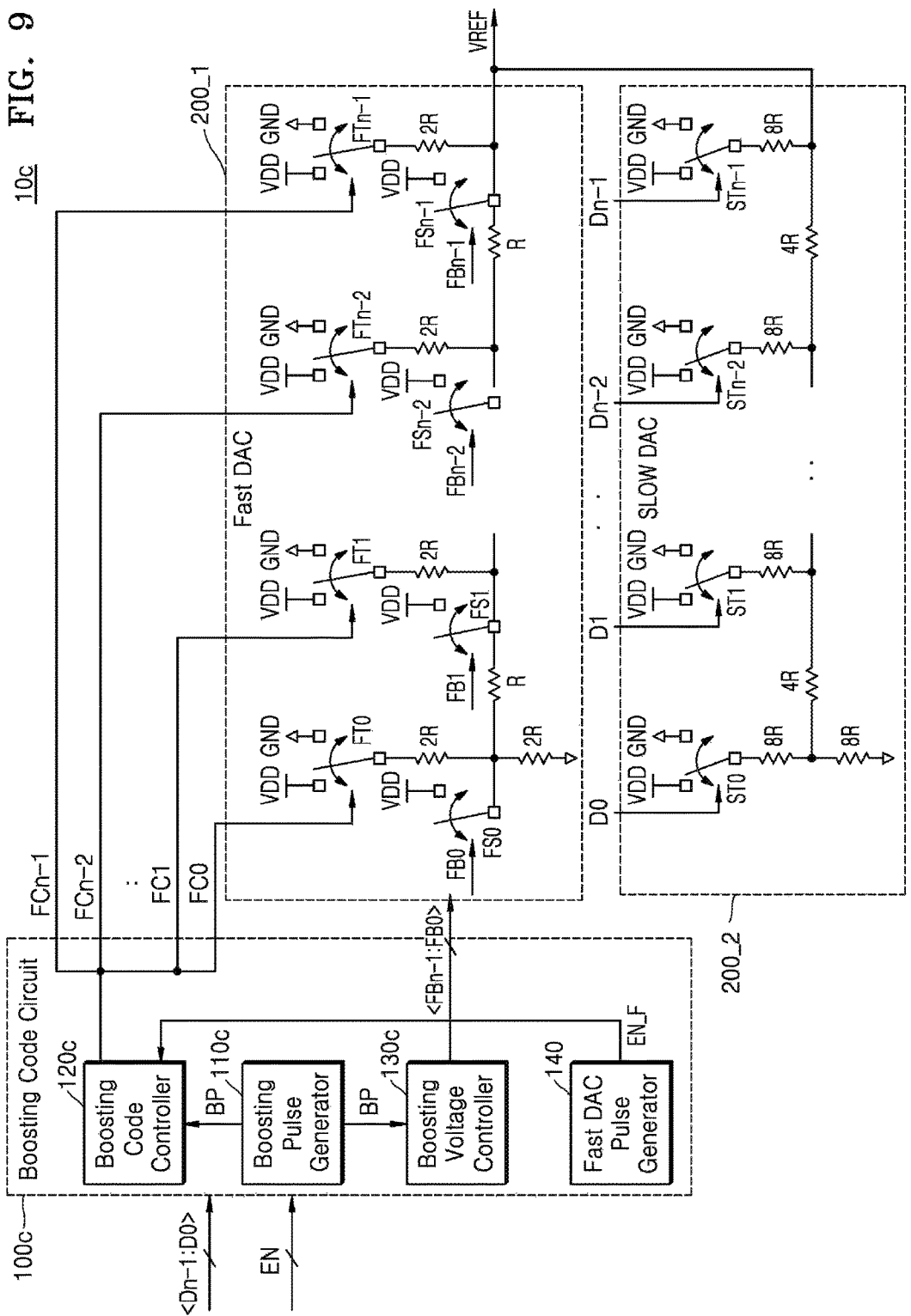
FIG. 9 is a block diagram of the reference voltage generator of FIG. 8 according to an example embodiment of the present disclosure.

FIG. 9 is a block diagram of the reference voltage generator 10c according to an example embodiment of the present disclosure.

Referring to FIG. 9, the reference voltage generator 10c may receive the reference code <Dn-1:D0> and the enable signal EN, and may generate the reference voltage VREF. The reference voltage generator 10c may include the boosting code circuit 100c, the fast DAC 200_1, and the slow DAC 200_2. The fast DAC 200_1 may correspond to the DAC 200b of FIG. 7.

The boosting code circuit 100c may include a boosting pulse generator 110c, a boosting code controller 120c, a boosting voltage controller 130c, and a fast DAC pulse generator 140. The boosting code circuit 100c may perform a boosting operation on the fast DAC 200_1 during a certain boosting time period.

The boosting pulse generator 110c may generate the boosting pulse BP having a first logic level (for example, logic high) during a boosting time period (e.g., a pulse duration) starting from a point in time at which the enable signal EN having a first logic level (e.g., a high level) is received and having a second logic level (e.g., a low level) after the boosting time period. In an embodiment, as described above with reference to FIGS. 3C and 6D, the boosting pulse generator 110c may determine a boosting time period based on the reference code <Dn-1:D0>. In some embodiments, the boosting pulse generator 110c may generate the boosting pulse BP having the same width regardless of the reference code <Dn-1:D0>.

The boosting code controller 120c may receive the reference code <Dn-1:D0>, the boosting pulse BP, and a fast DAC enable signal EN_F, and may output the first fast boosting code <FCn-1:FC0>, based on the reference code <Dn-1:D0>, the boosting pulse BP, and the fast DAC enable signal EN_F. For example, the boosting pulse BP has a boosting time period (e.g., a pulse duration) BT. In a state where the fast DAC enable signal EN_F has a first logic level (for example, a high level), the first fast boosting code <FCn-1:FC0> may be different from the reference code <Dn-1:D0> during the boosting time period BT, and may be the same as the reference code <Dn-1:D0> after the boosting time period BT. When the fast DAC enable signal EN_F is transitioned from the first logic level to a second logic level (for example, a low level), the boosting code controller 120c may output the first fast boosting code <FCn-1:FC0> allowing n switches FT0~FTn-1 of the fast DAC 200_1 to be connected to the ground voltage GND. For example, when the fast DAC enable signal EN_F is transitioned to a low level, the boosting code controller 120c may output the first fast boosting code <FCn-1:FC0> that is 00 . . . 00. Accordingly, when the fast DAC enable signal EN_F is transitioned to a low level, the fast DAC 200_1 may not perform a converting operation.

The boosting voltage controller 130c may receive the reference code <Dn-1:D0> and the boosting pulse BP, and may output the second fast boosting code <FBn-1:FB0>, based on the reference code <Dn-1:D0> and the boosting pulse BP. Due to the second fast boosting code <FBn-1:FB0>, at least one of the plurality of switches S0~Sn-1 of the fast DAC 200_1 may be connected to the power voltage VDD during the boosting time period BT. The second fast boosting code <FBn-1:FB0> may all have a value of 0 after the boosting time period BT. Description of the boosting code <Bn-1 :B0> given with reference to FIGS. 6A to 6D may be applied the same to the second fast boosting code <FBn-1:FB0>.

The fast DAC pulse generator 140 may generate the fast DAC enable signal EN_F having a first logic level (for example, logic high) during a fast DAC operation time starting from a point in time at which the enable signal EN having a high level is received and having a second logic level (for example, logic low) after the fast DAC operation time. The fast DAC operation time may be longer than the boosting time period BT. Accordingly, the fast DAC enable signal EN_F may have a pulse width FT wider than the boosting time period BT of the boosting pulse BP. The fast DAC pulse generator 140 may determine the fast DAC operation time, based on a value of the reference code <Dn-1:D0>. In an embodiment, the fast DAC pulse generator 140 may generate the fast DAC enable signal EN_F such that a fast DAC operation time increases as a value of the reference code <Dn-1:D0> increases.

The fast DAC 200_1 may generate the reference voltage VREF, based on the first fast boosting code <FCn-1 :FC0>, and a voltage level of the reference voltage VREF may be boosted during the boosting time period BT, based on the first fast boosting code <FCn-1 :FC0> and the second fast boosting code <FBn-1 :FB0>. An operation of the fast DAC 200_1 may be controlled based on the fast DAC enable signal EN_F. After the reference voltage VREF reaches a target voltage level VT, the fast DAC enable signal EN_F may be transitioned to a low level, and the fast DAC 200_1 may not operate.

In an embodiment, the fast DAC 200_1 may be an R-2R ladder DAC and may include the plurality of first resistors R and the plurality of second resistors 2R having different resistance values from each other, and each of the plurality of second resistors 2R may have twice as much a resistance value as each of the plurality of first resistors R.

The slow DAC 200_2 may receive the reference code <Dn-1:D0>, and may generate the reference voltage VREF based on the reference code <Dn-1:D0> when the enable signal EN has a first logic level.

In an embodiment, the slow DAC 200_2 may be an R-2R ladder DAC and may include a plurality of third resistors 4R and a plurality of fourth resistors 8R having different resistance values from the plurality of third resistors 4R, and each of the plurality of fourth resistors 8R may have twice as much a resistance value as each of the plurality of third resistors 4R. A resistance value of each of the plurality of third resistors 4R may be a multiple of a resistance value of each of the plurality of first resistors R of the fast DAC 200_1. For example, a resistance value of each of the plurality of third resistors 4R may be four times a resistance value of each of the plurality of first resistors R. Accordingly, the slow DAC 200_2 may have less power consumption than the fast DAC 200_1 and may increase a settling time of the reference voltage VREF to reach the target voltage level VT.

In example embodiments, the reference voltage generator 10c may decrease a settling time of the reference voltage VREF by using the fast DAC 200_1, and may reduce power consumption by driving only the slow DAC 200_2 after the reference voltage VREF reaches the target voltage level VT.

Although only the case in which the boosting code circuit 100c includes the boosting pulse generator 110c, the boosting code controller 120c, the boosting voltage controller 130c, and the fast DAC pulse generator 140 has been described with reference to FIG. 9, the boosting code circuit 100c may include at least one of the boosting code controller 120c and the boosting voltage controller 130c, and may perform a boosting operation due to the boosting code controller 120c or may perform a boosting operation due to the boosting voltage controller 130c.

Figure 10:
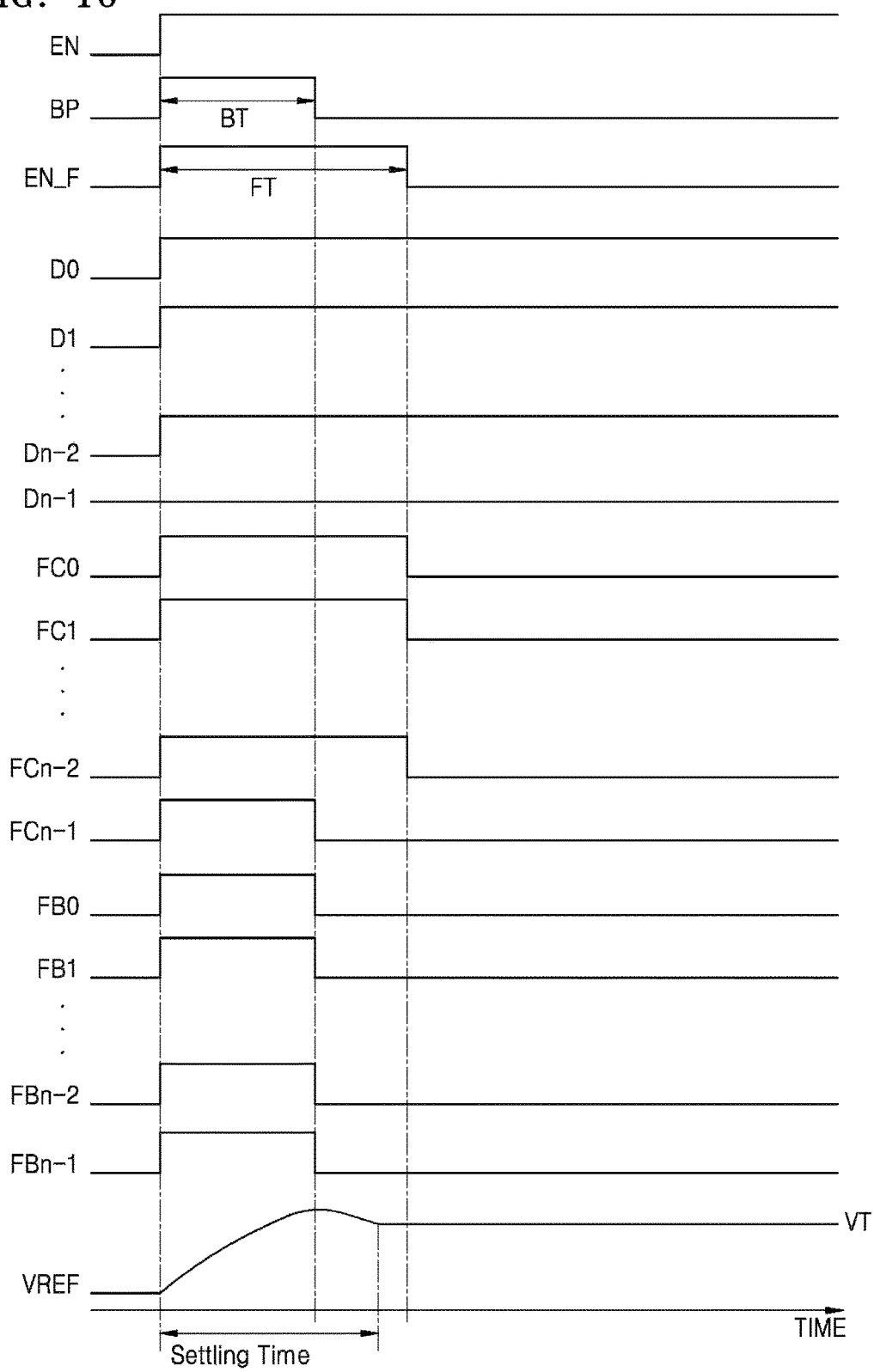
FIG. 10 is a timing diagram for describing an example embodiment of an operation of the reference voltage generator of FIG. 9.

FIG. 10 is a timing diagram for describing an example embodiment of an operation of the reference voltage generator 10c of FIG. 9.

Referring to FIGS. 9 and 10, the reference voltage generator 10c may generate the reference voltage VREF having a target voltage level corresponding to the reference code <Dn-1:D0>, based on the enable signal EN and the reference code <Dn-1:D0>.

The boosting code controller 120c may receive the reference code <Dn-1:D0>, the boosting pulse BP, and the fast DAC enable signal EN_F, and may output the first fast boosting code <FCn-1:FC0>. In an embodiment, the boosting code controller 120c may output the first fast boosting code <FCn-1:FC0> all having a value of 1 during a boosting time period BT, based on the boosting pulse BP having a high level. When the boosting time period BT is finished, the boosting code controller 120c may output the first fast boosting code <FCn-1:FC0> that is the same as the reference code <Dn-1:D0>, based on the fast DAC enable signal EN_F having a high level and the boosting pulse BP having a low level. When the fast DAC enable signal EN_F is transitioned to a low level, the boosting code controller 120c may output the first fast boosting code <FCn-1:FC0> all having a value of 0.

For example, when the reference code <Dn-1:D0> is 011 . . . 1, the boosting pulse generator 110c may generate the boosting pulse BP having a width of the boosting time period BT, and the fast DAC pulse generator 140 may generate the fast DAC enable signal EN_F, which is a pulse having a width of a fast DAC operation time FT.

The boosting code controller 120c may generate the first fast boosting code <FCn-1:FC0> that is 11 . . . 11 during the boosting time period BT, and may generate the first fast boosting code <FCn-1:FC0> that is 011 . . . 1 during the fast DAC operation time FT after the boosting time period BT. The boosting code controller 120c may generate the first fast boosting code <FCn-1:FC0> that is 00 . . . 00 after the fast DAC operation time FT.

The boosting voltage controller 130c may receive the reference code <Dn-1:D0> and the boosting pulse BP, and may output the second fast boosting code <FBn-1:FB0>. In an embodiment, the boosting voltage controller 130c may output the second fast boosting code <FBn-1:FB0> all having a value of 1 during the boosting time period BT, based on the boosting pulse BP having a high level. The boosting voltage controller 130c may output the second fast boosting code <FBn-1:FB0> all having a value of 0, based on the boosting pulse BP having a low level.

For example, when the reference code <Dn-1:D0> is 011 . . . 1, the boosting voltage controller 130c may generate the second fast boosting code <FBn-1:FB0> that is 11 . . . 11 during the boosting time period BT, and may generate the second fast boosting code <FBn-1:FB0> that is 00 . . . 00 after the boosting time period BT.

Although only the case where the first fast boosting code <FCn-1:FC0> and the second fast boosting code <FBn-1:FB0> all have a value of 1 during the boosting time period BT has been described with reference to FIG. 10, the reference voltage generator 10c according to an example embodiment of the present disclosure is not limited thereto. As in FIG. 3B, the first fast boosting code <FCn-1:FC0> may be generated to have a value that is twice as much as that of the reference code <Dn-1:D0> during the boosting time period BT. In addition, as in FIGS. 6B and 6C, the second fast boosting code <FBn-1:FB0> may be the same as the reference code <Dn-1:D0>, or may be generated to have a value that is twice as much as that of the reference code <Dn-1:D0>.

Figure 11:
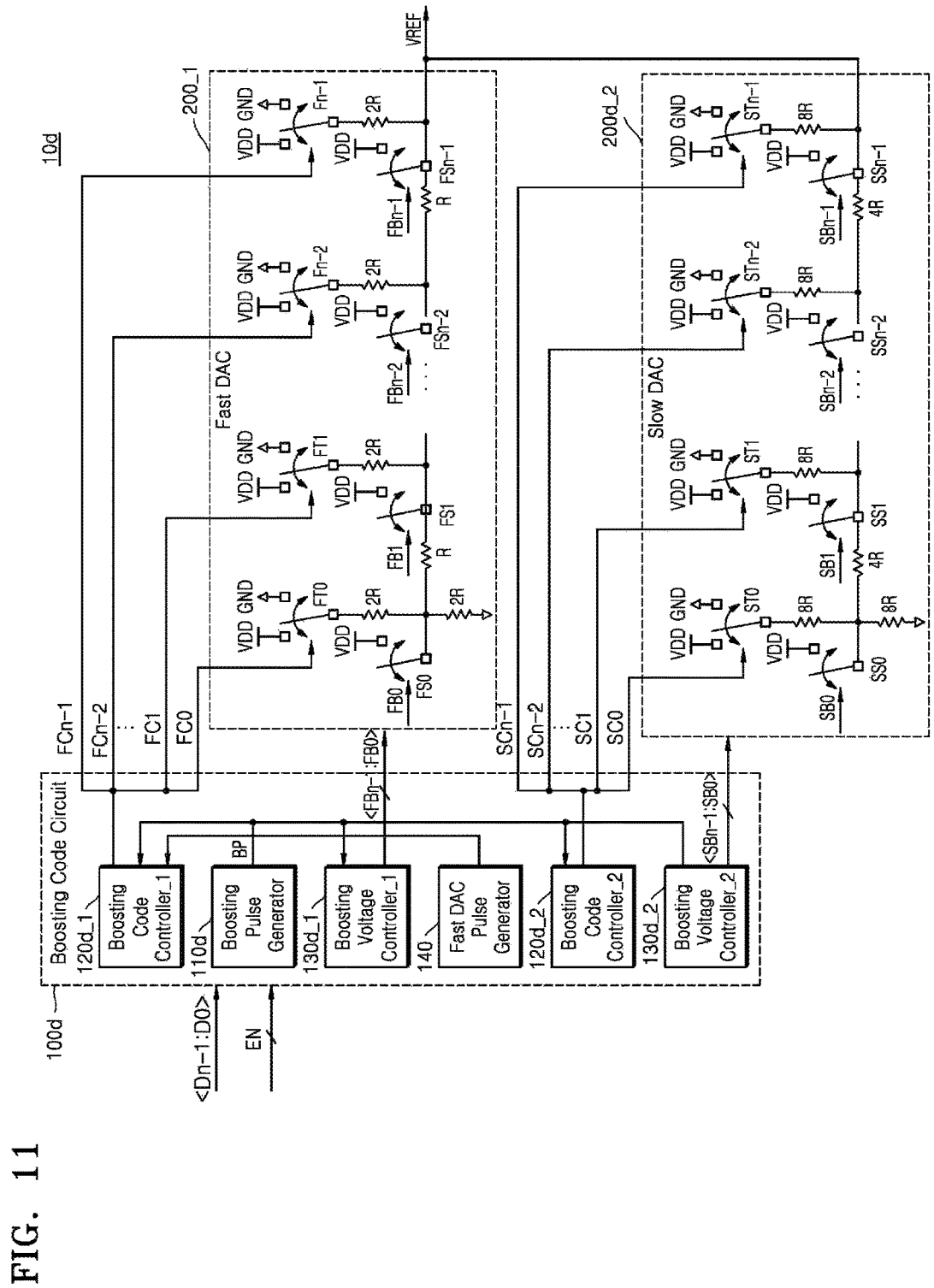
FIG. 11 is a block diagram of a reference voltage generator according to an example embodiment of the present disclosure.

FIG. 11 is a block diagram of a reference voltage generator 10d according to an example embodiment of the present disclosure. Description of the denotations of FIG. 11 that are the same as those of FIG. 9 will be omitted.

Referring to FIG. 11, the reference voltage generator 10d may include a boosting code circuit 100d, the fast DAC 200_1, and a slow DAC 200d_2.

The boosting code circuit 100d may include a boosting pulse generator 110d, a first boosting code controller 120d_1, a first boosting voltage controller 130d_1, the fast DAC pulse generator 140, a second boosting code controller 120d_2, and a second boosting voltage controller 130d_2. The boosting code circuit 100d may perform boosting operations on the fast DAC 200_1 and the slow DAC 200d_2 during the same boosting time period. Description of FIG. 9 may be applied to the boosting operation of the boosting code circuit 100d on the fast DAC 200_1. Accordingly, the first boosting code controller 120d_1 and the first boosting voltage controller 130d_1 of FIG. 11 may respectively correspond to the boosting code controller 120c and the boosting voltage controller 130c of FIG. 9.

The boosting pulse generator 110d may generate the boosting pulse BP having a first logic level (for example, a high level) during a boosting time period starting from a point in time at which the enable signal EN having a high level is received and having a second logic level (for example, a low level) after the boosting time period. In an embodiment, as described above with reference to FIGS. 3C and 6D, the boosting pulse generator 110d may determine a boosting time period, based on the reference code <Dn-1:D0>. In some embodiments, the boosting pulse generator 110d may generate the boosting pulse BP having a high level for a certain time period regardless of the reference code <Dn-1:D0>.

The second boosting code controller 120d_2 and the second boosting voltage controller 130d_2 of FIG. 11 may respectively correspond to the boosting code controller 120b and the boosting voltage controller 130b of FIG. 7. Accordingly, the second boosting code controller 120d_2 may receive the reference code <Dn-1:D0> and the boosting pulse BP, and may output a first slow boosting code <SCn-1:SC0>, based on the reference code <Dn-1:D0> and the boosting pulse BP. The first slow boosting code <SCn-1:SC0> may be different from the reference code <Dn-1:D0> during a boosting time period, and may be the same as the reference code <Dn-1:D0> after the boosting time period. For example, first slow boosting code <SCn-1:SC0> may be the same as one of the boosting code <Cn-1:C0> of FIGS. 3A to 3C.

The second boosting voltage controller 130d_2 may receive the reference code <Dn-1:D0> and the boosting pulse BP, and may output a second slow boosting code <SBn-1:SB0>, based on the reference code <Dn-1:D0> and the boosting pulse BP. Due to the second slow boosting code <SBn-1:SB0>, at least one of a plurality of switches SS0~SSn-1 of the slow DAC 200d_2 may be connected to the power voltage VDD during the boosting time period. The second slow boosting code <SBn-1:SB0> may all have a value of 0 after the boosting time period.

Although only the case in which the boosting code circuit 100d includes both of the second boosting code controller 120d_2 and the second boosting voltage controller 130d_2 has been described with reference to FIG. 11, the boosting code circuit 100d may include at least one of the second boosting code controller 120d_2 and the second boosting voltage controller 130d_2, and may perform a boosting operation due to the second boosting code controller 120d_2 or may perform a boosting operation due to the second boosting voltage controller 130d_2.

Accordingly, the boosting code circuit 100d included in the reference voltage generator 10d according to an example embodiment of the present disclosure may also perform a boosting operation on the slow DAC 200d_2 and thus may further reduce the settling time taken for the reference voltage VREF to reach a target voltage level.

Figure 12:
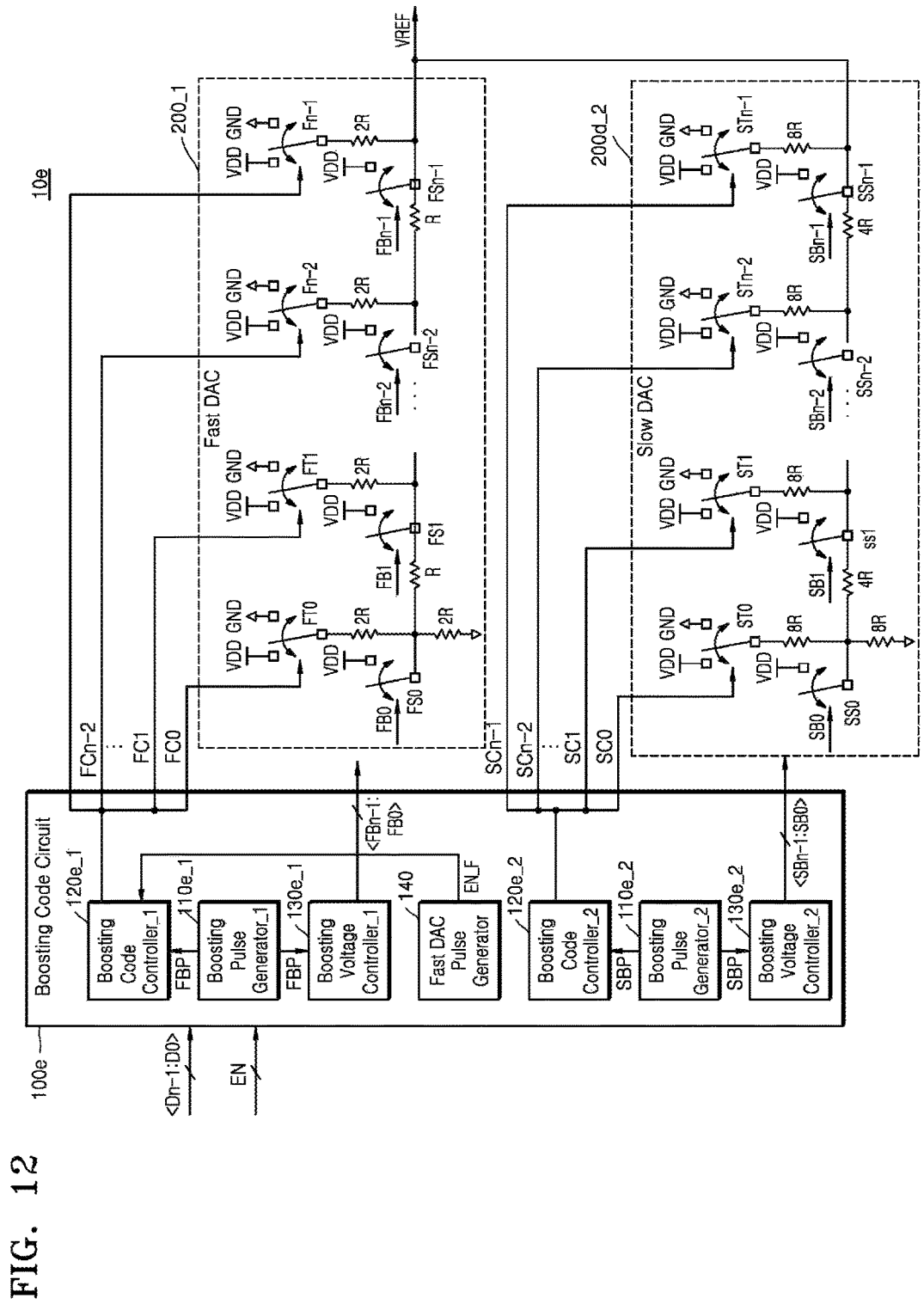
FIG. 12 is a block diagram of a reference voltage generator according to an example embodiment of the present disclosure.
Figure 13:
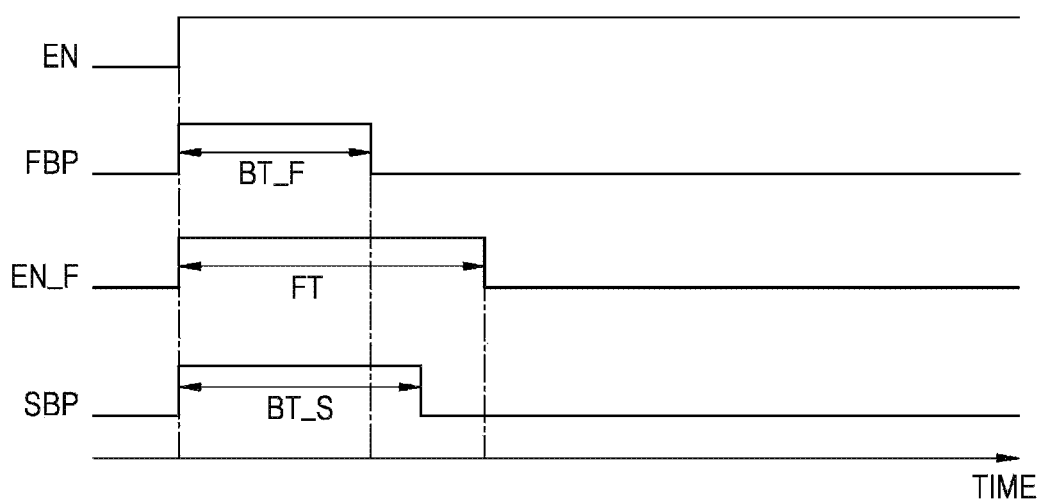
FIG. 13 is a timing diagram for describing an example embodiment of a fast boosting pulse and a slow boosting pulse of FIG. 12.

FIG. 12 is a block diagram of a reference voltage generator 10e according to an example embodiment of the present disclosure. Description of the denotations of FIG. 12 that are the same as those of FIGS. 9 and 11 will be omitted. Compared with FIG. 11, FIG. 12 features that boosting time periods for the fast DAC 200_1 and the slow DAC 200d_2 are different from each other. FIG. 13 is a timing diagram for describing a fast boosting pulse FBP and a slow boosting pulse SBP of FIG. 12.

Referring to FIG. 12, the reference voltage generator 10e may include a boosting code circuit 100e, the fast DAC 200_1, and the slow DAC 200d_2.

The boosting code circuit 100e may include a first boosting pulse generator 110e_1, a first boosting code controller 120e_1, a first boosting voltage controller 130e_1, the fast DAC pulse generator 140, a second boosting pulse generator 110e_2, a second boosting code controller 120e_2, and a second boosting voltage controller 130e_2. The boosting code circuit 100e may perform a boosting operation on the fast DAC 200_1 during a fast boosting time period and may perform a boosting operation on the slow DAC 200d_2 during a slow boosting time period.

Compared with the boosting code circuit 100d of FIG. 11, the boosting code circuit 100e may include the first boosting pulse generator 110e_1 and the second boosting pulse generator 110e_2. The first boosting pulse generator 110e_1 may generate the fast boosting pulse FBP, and the second boosting pulse generator 110e_2 may generate the slow boosting pulse SBP. The fast boosting pulse FBP may be generated to perform a boosting operation on the fast DAC 200_1, and the slow boosting pulse SBP may be generated to perform a boosting operation on the slow DAC 200d_2. Accordingly, the first boosting code controller 120e_1 and the first boosting voltage controller 130e_1 may receive the fast boosting pulse FBP from the first boosting pulse generator 110e_1, and the second boosting code controller 120e_2 and the second boosting voltage controller 130e_2 may receive the slow boosting pulse SBP from the second boosting pulse generator 110e_2.

Referring to FIGS. 12 and 13, the first boosting pulse generator 110e_1 may generate the fast boosting pulse FBP which is transitioned to a high level at a point in time when the enable signal EN is transitioned to a high level and is transitioned to a low level after a fast boosting time period BT_F. The second boosting pulse generator 110e_2 may generate the slow boosting pulse SBP which is transitioned to a high level at a point in time when the enable signal EN is transitioned to a high level and is transitioned to a low level after a slow boosting time period BT_S. In an embodiment, the slow boosting time period BT_S and the fast boosting time period BT_F may be different from each other. For example, the slow boosting time period BT_S may be longer than the fast boosting time period BT_F.

The settling time taken for the reference voltage VREF to reach a target voltage level may be longer for the slow DAC 200d_2 than for the fast DAC 200_1. Accordingly, the reference voltage generator 10e may generate the slow boosting pulse SBP having the slow boosting time period BT_S longer than the fast boosting time period BT_F, and may perform a long boosting operation on the slow DAC 200d_2.

In an embodiment, the slow boosting time period BT_S may be shorter than the fast DAC operation time FT. After a boosting operation on the slow DAC 200d_2 is finished, a converting operation of the fast DAC 200_1 may be finished.

In the reference voltage generator 10e according to an example embodiment of the present disclosure, the settling time taken to generate the reference voltage VREF having a target voltage level by converting the reference code <Dn-1:D0> may be reduced, and power consumed to generate the reference voltage VREF may be reduced by using the slow DAC 200d_2.

Figure 14:
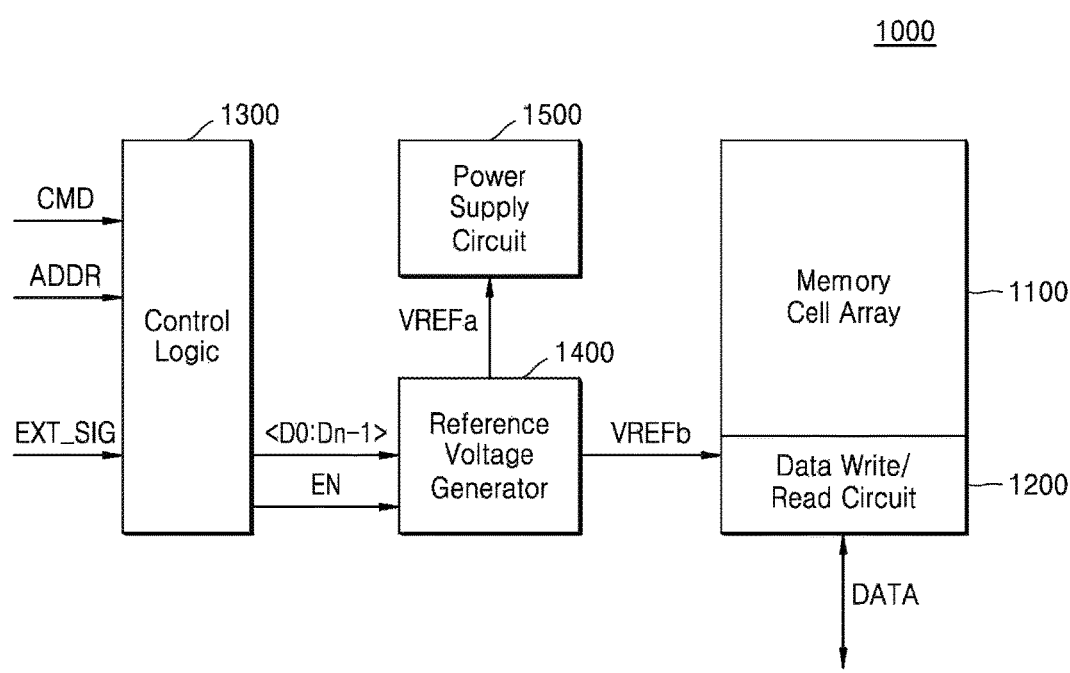
FIG. 14 is a block diagram of a semiconductor device including a reference voltage generator, according to an example embodiment of the present disclosure.

FIG. 14 is a block diagram of a semiconductor device (e.g., a memory device) 1000 including a reference voltage generator 1400, according to an example embodiment of the present disclosure. According to the example embodiment of the present disclosure, the memory device 1000 including the reference voltage generator 1400 may be, for example, a nonvolatile memory device such as electrically erasable programmable read-only memory (EEPROM), flash memory, phase change random access memory (PRAM), resistance random access memory (RRAM), nano floating gate memory (NFGM), polymer random access memory (PoRAM), magnetic random access memory (MRAM), or ferroelectric random access memory (FRAM). In some embodiments, the memory device 1000 may be a volatile memory device such as dynamic random access memory (DRAM), static random access memory (SRAM), mobile DRAM, double data rate synchronous dynamic random access memory (DDR SDRAM), low power DDR (LPDDR) SDRAM, graphic DDR (GDDR) SDRAM, or rambus dynamic random access memory (RDRAM).

Referring to FIG. 14, the memory device 1000 may include a memory cell array 1100, a data write/read circuit 1200, a control logic 1300, the reference voltage generator 1400, and a power supply circuit 1500.

The memory cell array 1100 may include a plurality of memory cells having a state corresponding to stored data. By generating a plurality of selection signals and bias signals, the data write/read circuit 1200 may write data DATA received from the outside to the plurality of memory cells or may read data DATA stored in the plurality of memory cells. For example, data write/read circuit 1200 may include, for example, a data input buffer, a data output buffer, an address buffer, a row decoder, a column decoder, a page buffer, etc.

The control logic 1300 may receive a command CMD, an address ADDR, and an external signal EXT_SIG from the outside of the memory device 1000, and may generate a plurality of control signals for controlling other elements of the memory device 1000.

The reference voltage generator 1400 may generate reference voltages VREFa and VREFb by digitally operating the reference code <Dn-1:D0> and an enable signal EN received from the control logic 1300. The reference voltage VREFa provided to the power supply circuit 1500 may be used to determine a level of power voltage or power current generated by the power supply circuit 1500. The power supply circuit 1500 may include a plurality of voltage generators to provide voltages or currents to internal circuits of the memory device 1000, for example, a word line, a bit line, etc. In addition, the reference voltage VREFb provided to the data write/read circuit 1200 may be used to determine a level of program voltage for data writing or determine a level of read voltage for data reading.

The reference voltage generator 1400 may be the reference voltage generators 10, 10a, 10b, 10c and 10d of FIGS. 1, 2, 4, 5, 7, 8, 9, 11 and 12. Accordingly, the reference voltage generator 1400 may rapidly generate the reference voltages VREFa and VREFb having a target voltage level corresponding to the reference code <Dn-1:D0> and may have little power consumption.

Figure 15:
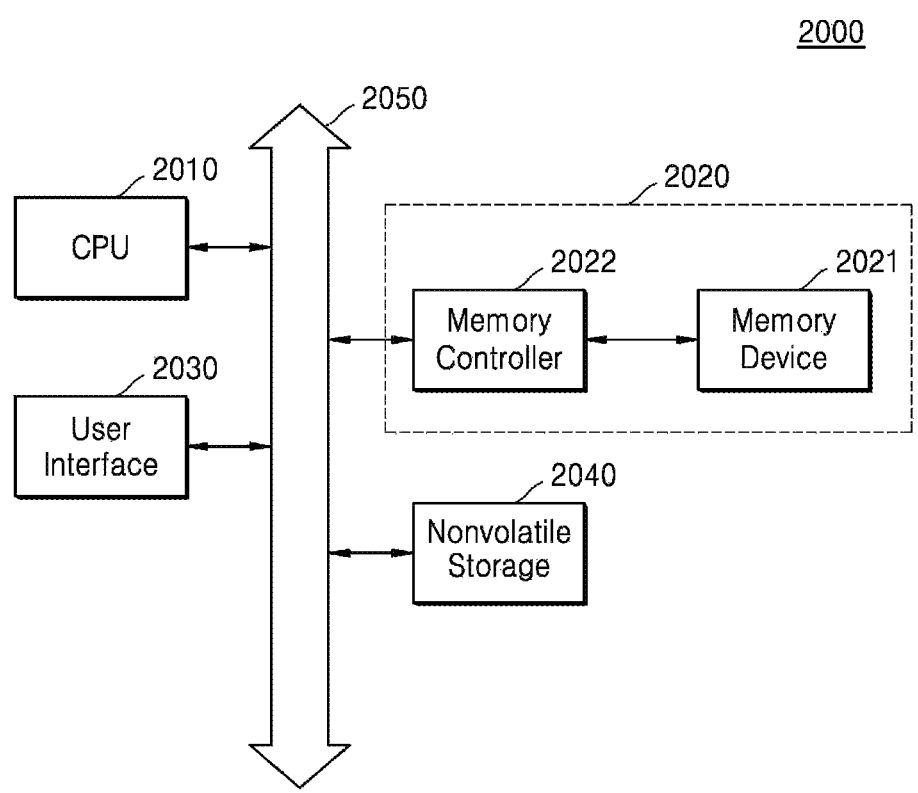
FIG. 15 is a block diagram illustrating a computing system according to an example embodiment of the present disclosure.

FIG. 15 is a block diagram illustrating a computing system 2000 according to an example embodiment of the present disclosure. As shown in FIG. 15, the computing system 2000 may include a central processing unit (CPU) 2010, a memory system 2020, a user interface 2030, and a nonvolatile storage 2040. The CPU 2010, the memory system 2020, the user interface 2030, and the nonvolatile storage 2040 may communicate with one another via a bus 2050. Although not shown in FIG. 15, the computing system 2000 may further include ports capable of communicating with a video card, a sound card, a memory card, a universal serial bus (USB) device, etc. or communicating with other electronic devices. The computing system 2000 may be implemented as a personal computer or a server, or may be implemented as a portable electronic device such as a notebook computer, a cellular phone, a personal digital assistant (PDA), or a camera.

The CPU 2010 may perform specific calculations or tasks. In some embodiments, the CPU 2010 may be a microprocessor or a graphics processing unit (GPU). The CPU 2010 may perform communication with the memory system 2020, the user interface 2030, and the nonvolatile storage 2040 via the bus 2050. The CPU 2010 may also be connected to an expansion bus such as a peripheral component interconnect (PCI) bus.

The memory system 2020 may include a semiconductor device such as a memory device 2021 and a memory controller 2022, and may store data needed for an operation of the computing system 2000. For example, the memory system 2020 may serve as a data memory of the CPU 2010, and may store data received from the bus 2050 by supporting a direct memory access (DMA), etc. or may transmit stored data to the bus 2050. The memory device 2021 according to example embodiments of the present disclosure may be included in the memory system 2020. For example, the memory device 2021 may include the reference voltage generator disclosed above, and the reference voltage generator may operate according to one of the above example embodiments of the present disclosure. For example, the reference voltage generator may rapidly generate a reference voltage and may consume little power to generate the reference voltage.

In example embodiments, the enable signal EN and the reference code <Dn-1:D0> may be generated from the memory controller 2022.

The user interface 2030 may include an input unit, such as a keyboard, a keypad, a mouse, etc., to receive an input signal from a user, and may include an output unit, such as a printer, a display device, etc., to provide an output signal to the user.

The nonvolatile storage 2040 may include, for example, a nonvolatile semiconductor memory device such as EEPROM, flash memory, PRAM, RRAM, NFGM, PoRAM, MRAM, or FRAM, or may include a magnetic disk, etc. The nonvolatile storage 2040 may include the reference voltage generator disclosed above, and the reference voltage generator may operate according to one of the above example embodiments of the present disclosure.

While the inventive concept has been particularly shown and described with reference to embodiments thereof, it will be understood that various changes in form and details may be made therein without departing from the spirit and scope of the following claims.

What is claimed is:

1. A semiconductor device comprising:
   a reference voltage generator comprising a boosting code circuit and a first digital-analog converter (DAC), the reference voltage generator being configured to output a reference voltage,
   wherein the boosting code circuit comprises a first boosting pulse generator configured to generate a first boosting pulse and a first boosting code controller configured to output a first boosting code based on a reference code and the first boosting pulse,
   wherein the first DAC is configured to output the reference voltage by converting the first boosting code, and
   wherein the first boosting code has a first code value different from the reference code when the first boosting pulse has a first logic level, and the first boosting code has the same value as the reference code when the first boosting pulse has a second logic level opposite to the first logic level.

2. The semiconductor device of claim 1, wherein the first DAC is configured to output the reference voltage having a first voltage level when the first boosting code has the first code value and output the reference voltage having a second voltage level less than the first voltage level when the first boosting code has the same value as the reference code.

3. The semiconductor device of claim 1, wherein the first DAC is configured such that the first DAC is controlled in response to the first code value to target an output voltage that is twice as much as the reference voltage when the first boosting code has the same value as the reference code.

4. The semiconductor device of claim 1, wherein the first boosting pulse generator is configured to determine a pulse width of the first boosting pulse based on the reference code.

5. The semiconductor device of claim 4, wherein the first boosting pulse generator is configured such that the pulse width of the first boosting pulse at the first logic level increases as a target voltage level of the reference voltage corresponding to the reference code increases.

6. The semiconductor device of claim 1, wherein the boosting code circuit further comprises a boosting voltage controller configured to output a second boosting code based on the reference code and the first boosting pulse, and
   wherein the first DAC comprises an R-2R ladder DAC and a plurality of switches, each switch connecting each of a plurality of nodes of the first DAC and a power voltage to each other based on the second boosting code.

7. The semiconductor device of claim 1, wherein the boosting code circuit further comprises a second boosting code controller configured to output a second boosting code based on the reference code and the first boosting pulse,
   wherein the reference voltage generator further comprises a second DAC configured to output the reference voltage by converting the second boosting code, and
   wherein the second boosting code has a second code value when the first boosting pulse has a first logic level, and has the same value as the reference code when the first boosting pulse has a second logic level opposite to the first logic level.

8. The semiconductor device of claim 7, wherein the boosting code circuit further comprises a second pulse generator configured to generate an enable signal to enable a converting operation of the first DAC.

9. The semiconductor device of claim 1, wherein the boosting code circuit further comprises a second boosting pulse generator configured to generate a second boosting pulse and a second boosting code controller configured to output a second boosting code based on the reference code and the second boosting pulse,
   wherein the reference voltage generator further comprises a second DAC configured to output the reference voltage by converting the second boosting code, and
   wherein the second boosting code has a second code value based on the reference code when the second boosting pulse has a first logic level, and has the same value as the reference code when the second boosting pulse has a second logic level opposite to the first logic level.

10. The semiconductor device of claim 9, wherein a pulse width of the first boosting pulse at the first logic level is less than a pulse width of the second boosting pulse at the first logic level.

11. A semiconductor device comprising:
    a reference voltage generator comprising a boosting code circuit and a first digital-analog converter (DAC), the reference voltage generator being configured to output a reference voltage,
    wherein the boosting code circuit comprises a boosting pulse generator configured to generate a boosting pulse, and a boosting code controller configured to output a boosting code based on a reference code and the boosting pulse, and wherein the first DAC is configured to output the reference voltage having a first voltage level by converting the boosting code having a different value from the reference code during a pulse duration of the boosting pulse, and output the reference voltage having a second voltage level less than the first voltage level by converting the boosting code having the same value as the reference code after the pulse duration of the boosting pulse when the boosting code circuit is activated.

12. The semiconductor device of claim 11, wherein the first DAC comprises an R-2R ladder DAC and a plurality of first switches, each first switch connecting a first end of each resistor 2R and a power voltage or a ground voltage to each other based on the boosting code.

13. The semiconductor device of claim 12, wherein the boosting code circuit further comprises a boosting voltage controller configured to output a second boosting code based on the reference code and the boosting pulse, wherein the first DAC comprises a plurality of second switches, each second switch connecting each node of a plurality of nodes of the first DAC and the power voltage to each other based on the second boosting code, and wherein each node of the plurality of nodes of the first DAC is connected to a second end of each resistor 2R.

14. The semiconductor device of claim 13, wherein the boosting voltage controller is configured to connect at least one of the plurality of second switches to the power voltage during the pulse duration of the boosting pulse, and allows the plurality of second switches to open after the pulse duration of the boosting pulse.

15. The semiconductor device of claim 11, wherein the first voltage level is twice of the second voltage level when the boosting code has a value that is twice as much as that of the reference code.

16. The semiconductor device of claim 11, wherein the boosting pulse generator is configured to determine a pulse width of the boosting pulse based on the reference code.

17. The semiconductor device of claim 16, wherein the boosting pulse generator is configured to generate the boosting pulse such that the pulse duration of the boosting pulse increases as a target voltage level of the reference voltage increases.

18. The semiconductor device of claim 11, further comprising:
a second DAC configured to output the reference voltage on an output node connected to the first DAC by converting the reference code.

19. A semiconductor device comprising:
a reference voltage generator comprising a boosting code circuit and a digital-analog converter (DAC), the reference voltage generator being configured to output a reference voltage,
wherein the boosting code circuit includes a boosting code controller configured to output a boosting code based on a reference code, and
wherein the DAC is configured to output the reference voltage having a first voltage level by converting the boosting code having a different value from the reference code during a first period of time after enabling the boosting code circuit, and output the reference voltage having a second voltage level less than the first voltage level by converting the boosting code having the same value as the reference code during a second period of time after the first period of time.

20. The semiconductor device of claim 19, wherein the boosting code circuit further comprises a boosting pulse generator configured to generate a boosting pulse signal, the boosting pulse signal including a pulse width during the first period of time and maintaining at a particular logic level during the second period of time.

* * * * *